(12) United States Patent
Jang et al.

(10) Patent No.: US 10,937,471 B2
(45) Date of Patent: *Mar. 2, 2021

(54) NON-VOLATILE MEMORY DEVICE AND STORAGE DEVICE INCLUDING THE SAME

(71) Applicant: SAMSUNG ELECTRONICS CO., LTD., Suwon-si (KR)

(72) Inventors: Dong-Su Jang, Seongnam-si (KR); Man-Jae Yang, Hwaseong-si (KR); Jeong-Don Ihm, Seongnam-si (KR); Go-Eun Jung, Hwaseong-si (KR); Byung-Hoon Jeong, Hwaseong-si (KR); Young-Don Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/933,768

(22) Filed: Jul. 20, 2020

(65) Prior Publication Data

US 2020/0349986 A1 Nov. 5, 2020

Related U.S. Application Data

(63) Continuation of application No. 16/802,084, filed on Feb. 26, 2020, now Pat. No. 10,741,225, which is a (Continued)

(30) Foreign Application Priority Data

Sep. 28, 2017 (KR) ........................ 10-2017-0126354

(51) Int. Cl.
*G11C 7/00* (2006.01)
*G11C 7/10* (2006.01)
(Continued)

(52) U.S. Cl.
CPC ............ *G11C 7/106* (2013.01); *G11C 7/1033* (2013.01); *G11C 7/1039* (2013.01);
(Continued)

(58) Field of Classification Search
CPC ..... G11C 7/106; G11C 7/1033; G11C 7/1039; G11C 7/1087; G11C 7/22; G11C 7/222;
(Continued)

(56) References Cited

U.S. PATENT DOCUMENTS 6,574,153 B2 6/2003 Ware et al.
6,963,517 B2 11/2005 Chen
(Continued)

FOREIGN PATENT DOCUMENTS

KR 10-2015-0138933 12/2015

OTHER PUBLICATIONS

Office Action dated Jul. 30, 2019 in Corresponding U.S. Appl. No. 15/975,266.
(Continued)

*Primary Examiner* — Viet Q Nguyen
(74) *Attorney, Agent, or Firm* — F. Chau & Associates, LLC

(57) ABSTRACT

A non-volatile memory device includes a serial pipeline structure connected to an output stage of a First In, First Out (FIFO) memory. The FIFO memory is configured to store data transmitted through a data path having a wave pipeline structure based on a plurality of FIFO input clock signals and output the stored data based on a plurality of FIFO output clock signals. A serializer is configured to output data to an input/output pad based on a select clock signal. The serial pipeline structure is connected between the FIFO memory and the serializer and configured to compensate for a phase difference between the data output from the FIFO memory and the select clock signal.

20 Claims, 22 Drawing Sheets

Related U.S. Application Data continuation of application No. 15/975,266, filed on May 9, 2018, now Pat. No. 10,600,454.

(51) Int. Cl.
| | | |
|---|---|---|
| *G11C 11/4096* | (2006.01) | |
| *G11C 7/22* | (2006.01) | |
| *G11C 11/4076* | (2006.01) | |
| *G11C 5/06* | (2006.01) | |
| *G11C 16/26* | (2006.01) | |

(52) U.S. Cl.
CPC .............. *G11C 7/1087* (2013.01); *G11C 7/22* (2013.01); *G11C 7/222* (2013.01); *G11C 11/4076* (2013.01); *G11C 11/4096* (2013.01); *G11C 5/066* (2013.01); *G11C 7/1066* (2013.01); *G11C 16/26* (2013.01); *G11C 2207/107* (2013.01)

(58) Field of Classification Search
CPC . G11C 11/4076; G11C 11/4096; G11C 5/066; G11C 7/1066; G11C 16/26; G11C 2207/107
USPC .............................. 365/194, 63, 185.05, 193
See application file for complete search history.

(56) References Cited

U.S. PATENT DOCUMENTS

| | | | |
|---|---|---|---|
| 7,388,417 B2 | 6/2008 | Kim et al. | |
| 7,437,500 B2 | 10/2008 | Butt et al. | |
| 7,979,605 B2 | 7/2011 | Jeong et al. | |
| 8,176,354 B2 | 5/2012 | Jacobson | |
| 8,230,140 B2 | 7/2012 | Jeong et al. | |
| 8,432,768 B2 | 4/2013 | Ware et al. | |
| 9,043,633 B2 | 5/2015 | Ware et al. | |
| 9,183,900 B2 | 11/2015 | Lee | |
| 9,460,803 B1 | 10/2016 | Tang et al. | |
| 9,576,626 B2 * | 2/2017 | Jang | G11C 29/028 |
| 9,773,566 B2 * | 9/2017 | Jang | G11C 29/028 |
| 10,241,938 B1 | 3/2019 | Sim et al. | |
| 10,331,193 B2 | 6/2019 | Ware et al. | |
| 10,360,956 B2 | 7/2019 | Shakeri et al. | |
| 10,600,454 B2 * | 3/2020 | Jang | G11C 7/1087 |
| 10,741,225 B2 * | 8/2020 | Jang | G11C 7/22 |
| 2011/0235459 A1 | 9/2011 | Ware et al. | |
| 2013/0033946 A1 | 2/2013 | Ware et al. | |
| 2013/0235683 A1 | 9/2013 | Oh et al. | |
| 2014/0089575 A1 | 3/2014 | Mes | |
| 2017/0125115 A1 | 5/2017 | Jang et al. | |
| 2019/0096447 A1 | 3/2019 | Jang et al. | |
| 2019/0180801 A1 | 6/2019 | Shakeri et al. | |
| 2019/0180802 A1 | 6/2019 | Shakeri et al. | |
| 2020/0194040 A1 | 6/2020 | Jang et al. | |

OTHER PUBLICATIONS

Notice of Allowance dated Apr. 6, 2020 in Corresponding U.S. Appl. No. 16/802,084.

* cited by examiner

NON-VOLATILE MEMORY DEVICE AND STORAGE DEVICE INCLUDING THE SAME

CROSS-REFERENCE TO RELATED APPLICATION

This application is a continuation of U.S. patent application Ser. No. 16/802,084 filed Feb. 26, 2020, which is a continuation of U.S. patent application Ser. No. 15/975,266 filed May 9, 2018, and issued as U.S. Pat. No. 10,600,454 on Mar. 24, 2020, which claims the benefit of priority from Korean Patent Application No. 10-2017-0126354, filed on Sep. 28, 2017, in the Korean Intellectual Property Office, the disclosures of which are incorporated by reference herein, in their entirety.

TECHNICAL FIELD

The inventive concept relates to a non-volatile memory device, and more particularly, to a non-volatile memory device for sequentially reading out data and a storage device including the same.

DISCUSSION OF THE RELATED ART

Semiconductor memory devices may be categorized into volatile memory devices that lose data stored therein when a supply of power is interrupted, and non-volatile memory devices that do not lose data stored therein, even when there is a loss or interruption of power. A volatile semiconductor memory device features fast read and write speeds, but data stored therein is lost when an external power supply is interrupted. On the other hand, a non-volatile semiconductor memory device features slow read and write speeds as compared to a volatile semiconductor memory device, but data stored therein is retained even when an external power supply is interrupted.

However, as the operating frequencies of systems using non-volatile semiconductor memory devices increase, there is demand for operation of a nonvolatile semiconductor memory device at a higher speed than current capabilities, and various ideas are therefore being researched.

SUMMARY

The inventive concept provides an apparatus and method of eliminating a phase difference between data and a select clock signal of a data multiplexer, and the performing of a data read operation at higher speeds than known heretofore. According to an embodiment of the inventive concept, a combination of a wave pipeline and a serial pipeline are provided to a non-volatile memory device and a storage device including the same.

According to an embodiment of the inventive concept, there is provided a non-volatile memory device including a First In, First Out (FIFO) memory configured to store data transmitted through a data path having a wave pipeline structure based on a plurality of FIFO input clock signals and output the stored data based on a plurality of FIFO output clock signals; a serializer configured to output data to an input/output pad based on a select clock signal; and a serial pipeline structure connected between the FIFO memory and the serializer and configured to compensate for a phase difference between the stored data output from the FIFO memory and the select clock signal.

According to an embodiment of the inventive concept, there is provided a non-volatile memory device including at least one memory cell array; a plurality of page buffer circuits connected to the at least one memory cell array through a plurality of bit lines; and an output buffer circuit connected to the plurality of page buffer circuits and including at least one pipeline output stage, wherein the at least one pipeline output stage includes a hybrid pipeline output stage including a First In, First Out (FIFO) memory and a serial pipeline structure.

According to an embodiment of the inventive concept, there is provided a storage device including at least one non-volatile memory device including a First In, First Out (FIFO) memory configured to sequentially receive data transmitted through a data path having a wave pipeline structure and sequentially output data; and a serial pipeline structure configured to advance a phase of the output data and output the phase-advanced data; and a memory controller configured to control whether to operate the at least one non-volatile memory device at a high-speed operating mode, wherein the memory controller is configured to adjust latency for operating the at least one non-volatile memory device in high-speed operating mode that operates faster than a low-speed operating mode.

According to an embodiment of the inventive concept, a non-volatile memory device, may include a First In, First Out (FIFO) memory configured to store data transmitted through a data path having a wave pipeline structure; a serial pipeline structure including a plurality of serial pipelines connected in series to the FIFO memory; and a data multiplexer configured to output data to an input/output pad based on a select clock signal; wherein each one of the plurality of serial pipelines is configured to be controlled by a respective serial pipeline drive clock signal of a plurality of serial pipeline drive clock signals, in which a phase of the serial pipeline drive clock signals increase over a data path from the FIFO memory to the data multiplexer.

According to an embodiment of the inventive concept. a method of eliminating a phase difference in a non-volatile memory device may include storing data, by a First In, First Out (FIFO) memory, transmitted through a data path having a wave pipeline structure based on a plurality of FIFO input clock signals and outputting the stored data based on a plurality of FIFO output clock signals; generating, by a serial pipeline generator, a plurality of serial pipeline driving clock signals that compensate for a phase difference between the stored data output from the FIFO memory and a select clock signal provided to a serializer, a serial pipeline structure including a plurality of serial pipelines, and the serial pipeline structure is connected between the FIFO memory and the serializer; and outputting, by the serializer, data to an input/output pad based on the select clock signal provided to the serializer.

BRIEF DESCRIPTION OF THE DRAWINGS

Embodiments of the inventive concept will be better appreciated by a person of ordinary skill in the art from the following detailed description taken in conjunction with the accompanying drawings in which.

DETAILED DESCRIPTION OF THE EMBODIMENTS

Figure 1:
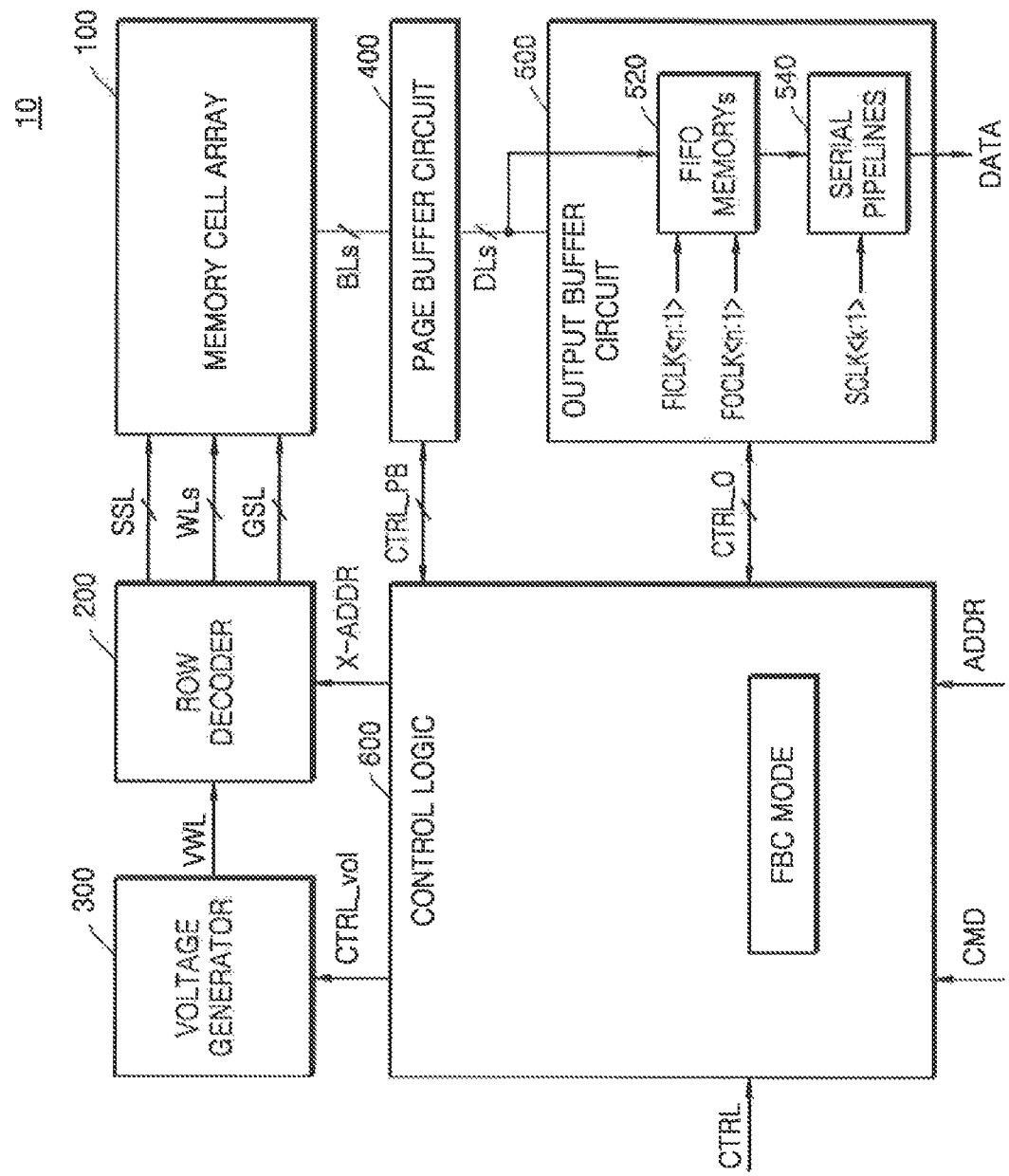
FIG. 1 is a diagram showing a non-volatile memory device according to an example embodiment of the inventive concept.

FIG. 1 is a diagram showing a non-volatile memory device 10 according to an example embodiment of the inventive concept. The non-volatile memory device 10 may include a memory cell array 100, a row decoder 200, a voltage generator 300, a page buffer circuit 400, an output buffer circuit 500, and control logic 600. However, the configuration of the non-volatile memory device 10 is not limited to the depiction of FIG. 1, and the non-volatile memory device 10 may further include other components not shown, such as an input buffer circuit and a column decoder.

Although FIG. 1 shows a non-volatile memory device 10 including one memory cell array 100, embodiments of the inventive concept are not limited thereto. For example, the non-volatile memory device 10 may include a plurality of memory cell arrays 100. The non-volatile memory device 10 of the inventive concept may include, for example, a NAND flash memory, a vertical NAND (VNAND) flash memory, a NOR flash memory, a resistive random-access memory (RRAM), a phase-change random-access memory (PRAM), a magnetoresistive random-access memory (MRAM), a ferroelectric a random-access memory (FRAM), spin-transfer torque random-access memory (STT-RAM), etc. The non-volatile memory device 10 may have a three-dimensional array structure. Hereinafter, for the convenience of explanation, while it is assumed that the non-volatile memory device 10 is a NAND flash memory device, a person of ordinary skill in the art should understand and appreciate that embodiments of the inventive concept are not limited thereto.

The memory cell array 100 may include a plurality of memory blocks. However, only one block is shown for convenience of explanation. A memory block may include a plurality of memory cells. Each memory cell may be a multi-level cell (MLC) storing two or more bits of data. However, embodiments of the inventive concept are not limited thereto. For example, some memory cells may be single level cells (SLC) each storing 1-bit data, whereas some other memory cells may be MLCs.

The memory cell array 100 may be connected to the row decoder 200 through the word lines WLs, the string select lines SSL and the ground select lines GSL. In addition, the memory cell array may be connected to the page buffer circuit 400 through the bit lines BLs. The memory cell array 100 may include strings connected to the bit lines BLs. Each of the strings may include at least one string select transistor, a plurality of memory cells, and at least one ground select transistor that are connected in series between a bit line and a common source line CSL. Each of the strings may further include at least one dummy cell between the string select transistor and the plurality of memory cells and may further include at least one dummy cell between the ground select transistor and the plurality of memory cells.

The row decoder 200 may select at least some of the word lines WLs based on a row address X-ADDR. The row decoder 200 may provide a word line voltage to a word line. During a program operation, the row decoder 200 may apply a program voltage and a verify voltage to a selected word line and apply a program inhibit voltage to an unselected word line. During a read operation, the row decoder 200 may apply a read voltage to a selected word line and apply a read inhibit voltage to an unselected word line. Furthermore, the row decoder 200 may select some of the string select lines SSL or some of the ground select lines GSL based on the row address X-ADDR.

The voltage generator 300 may generate various types of voltages for performing a program operation, a read operation, and an erase operation with regard to the memory cell array 100 based on a voltage control signal CTRL_vol. For example, the voltage generator 300 may generate a word line drive voltage VWL to drive the word lines WLs. At this stage, the word line drive voltage VWL may be a program voltage (or a write voltage), a read voltage, an erase voltage, an inhibit voltage, or a program verify voltage. Although not shown, the voltage generator 300 may further generate a string select line driving voltage VSSL for driving a plurality of string select lines SSL and a ground select line driving voltage VGSL for driving a plurality of ground select lines GSL.

The page buffer circuit 400 may be connected to the memory cell array 100 through the bit lines BLs and may perform a program operation, or a read operation, in response to a page buffer control signal CTRL_PB received from the control logic 600. The page buffer circuit 400 may be connected to data lines DLs by selecting the bit lines BLs by using a decoded column address. Here, the number of data lines DLs may be less than the number of bit lines BLs.

The page buffer circuit 400 may include, for example, a plurality of page buffers for storing data to be programmed during a program operation or storing data to be read out during a read operation. Each of the plurality of page buffers may include a plurality of latches. During a program operation, the data stored in the plurality of page buffers may be programmed into a page corresponding to a selected memory block through the bit lines BLs. During a read operation, data read out from a page corresponding to a selected memory block may be stored in one or more of the plurality of page buffers through the bit lines BLs. The page buffer circuit 400 may read data from a first area of the memory cell array 100 and store the read data in a second area of the memory cell array 100. For example, the page buffer circuit 400 may be configured to perform a copyback.

The control logic 600 may output various internal control signals for storing data in the memory cell array 100, or reading out data from the memory cell array 100, based on a command CMD, an address ADDR, and a control signal CTRL received from a memory controller. The control logic 600 may control the overall operations of the internal components of the non-volatile memory device 10. Various internal control signals output from the control logic 600 may be provided to the row decoder 200, the voltage generator 300, the page buffer circuit 400, and the output buffer circuit 500. For example, the control logic 600 may provide a row address X-ADDR to the row decoder 200, provide a voltage control signal CTRL_vol to the voltage generator 300, a page buffer control signal CTRL_PB to the page buffer circuit 400, and provide an output control signal CTRL_O to the output buffer circuit 500. However, the inventive concept is not limited thereto, and the control logic 600 may further provide other internal control signals. For example, the control logic 600 may provide a column address to a column decoder.

The control logic 600 may also support a fail bit count (FBC) mode for performing a fail bit count function to ensure data integrity of read-out data transmitted to the data lines DLs. In the FBC mode, fail bits may be counted by comparing the read-out data transmitted to the data lines DLs with expected data. The FBC mode may be selectively performed according to an external request. For example, the FBC mode may be activated during a read operation in a fast mode and may be activated only for some column addresses. Since the non-volatile memory device 10 supports the FBC mode, the reliability of read-out data may be increased.

The output buffer circuit 500 may be connected to at least the one page buffer circuit 400 through the data lines DLs. During a data read operation, the output buffer circuit 500 may output data read by the page buffer circuit 400 to the outside through the data lines DLs.

During a data read operation, the data read operation may be performed according to a hybrid pipeline method, which is a combination of a wave pipeline method using the First In, First Out (FIFO) memories 520 and a serial pipeline method using a serial pipeline structure 540. The page buffer circuit 400 may sequentially output data stored in the page buffer circuit 400 to the data lines DLs according to a wave pipeline method in response to a column address input and a provided page buffer control signal CTRL_PB. The FIFO memories 520 may sequentially receive data to be transmitted to the data lines DLs based on a plurality of FIFO input clock signals FICLK<n:1> (n is a natural number equal to or greater than 2) and sequentially output data based on clock signals FOCLK<n:1>.

As the FIFO depth of the FIFO memories 520 increases, the phase of data output from the FIFO memories 520 may be delayed. To compensate for the delayed phase, the output buffer circuit 500 may include the serial pipeline structure 540. The serial pipeline structure 540 may include a plurality of serial pipelines 542_1, 542_2, . . . 542_K (see FIG. 2), the serial pipeline structure 540 may change the phase of data received from the FIFO memories 520 based on a serial pipeline driving clock signal, and output the data. For example, the data input to the serial pipeline structure 540 may have the same phase, or a slightly faster phase, than the FIFO output clock signals FOCLK<n:1>, and data output from the serial pipeline structure 540 may have the same phase, or a slightly slower phase, than a select clock signal that operates a serializer (data multiplexer 560 of FIG. 2) at the front end of an input/output pad. The serializer may be implemented as a data multiplexer 560. In one embodiment of the inventive concept, the terms "slightly faster" and "slightly slower" may be less than about a 3% difference in phase. In another embodiment of the inventive concept, the terms "slightly faster" and "slightly slower" may less than about a 5% difference in phase. In yet another embodiment of the inventive concept, the terms "slightly faster" and "slightly slower" may less than about a 10% difference in phase. In yet another embodiment of the inventive concept, the terms "slightly faster" and "slightly slower" may less than about a 15-20% difference in phase.

Although the serializer will hereinafter be described as a data multiplexer 560, embodiments of the inventive concept are not limited thereto.

The data read operation of the output buffer circuit 500 will be described in more detail with reference to the following drawings.

The non-volatile memory device 10 according to an example embodiment of the inventive concept may perform a high-speed read operation by using a hybrid pipeline method, which is a combination of a wave pipeline method and a serial pipeline method.

Figure 2:
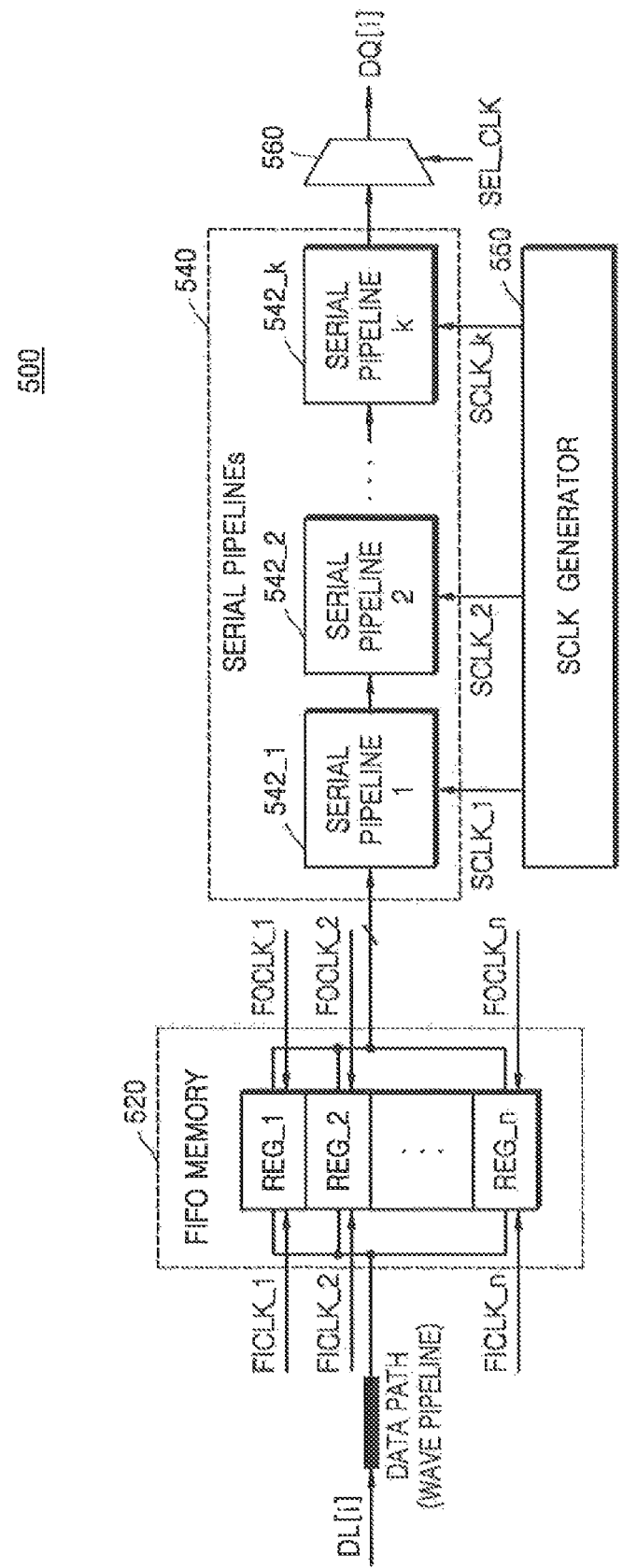
FIG. 2 is a diagram showing a data read operation in an output buffer circuit according to an example embodiment of the inventive concept.

FIG. 2 is a diagram showing a data read operation in an output buffer circuit according to an example embodiment of the inventive concept.

The page buffer circuit 400 (FIG. 1) outputs data through the plurality of data lines DLs, but for the convenience of explanation, a process of reading data transmitted through one data line DL[i] will now be described. Data read through the data line DL[i] may be input to an output buffer circuit through a data path having a wave pipeline structure. Typically, in "wave pipelines", data may flow in waves through the pipeline, and each wave is kept as short as possible. The delays in the pipeline may be balanced so the difference between the first stabilized output data and the last is minimized for each stage. A maximum rate that data may be input to a wave pipeline may be determined as a greatest difference in delay between a first piece of data exiting the pipeline and a last piece of data, for a particular wave. When data is fed faster than the maximum data rate, there may be interference amongst the data waves.

The output buffer circuit may 500 include a FIFO memory 520, the serial pipeline structure 540, and a data multiplexer (or serializer) 560. The data multiplexer 560 may be connected to a data input/output pad DQ[i]. In a data read mode, data transmitted through a data path having a wave pipeline structure may be output through the FIFO memory 520, the serial pipeline structure 540, and the data multiplexer 560.

The FIFO memory 520 may include "n" registers REG_1 through REG_n (n is a natural number) for storing data. The "n" number of registers may be referred to as the FIFO depth of the FIFO memory 520. The structure of each of the registers REG_1 through REG_n may be described with reference to FIG. 3.

Each of the registers REG_1 through REG_n of the FIFO memory 520 may sequentially store data input in response to FIFO input clock signals FICLK_1 through FICLK_n and sequentially output the data in response to FIFO output clock signals FOCLK_1 through FOCLK_n. The FIFO output clock signals FOCLK_1 through FOCLK_n may have a latency corresponding to a propagation delay, unlike the FIFO input clock signals FICLK_1 through FICLK_n. A non-volatile memory device may include a FIFO input clock generator to generate a plurality of FIFO input clock signals FICLK_1 through FICLK_n and a FIFO output clock generator to generate a plurality of FIFO output clock signals FOCLK_1 through FOCLK_n. The FIFO input clock generator and the FIFO output clock generator may be described with reference to FIGS. 8A and 8B.

While a delay time from a page buffer circuit to an input/output pad is constant, there may be an increase in latency delay because a non-volatile memory device operates faster. Since a larger latency delay may be utilized, the FIFO depth of the FIFO memory 520 may increase, and thus an output load of the FIFO memory 520 may increase. When the output load increases, a data transmission time to the data multiplexer 560 may increase. However, since a select clock signal SEL_CLK of the data multiplexer 560 is directly related to the jitter characteristic of a non-volatile memory device, a path through which the select clock signal SEL_CLK is transmitted may be designed as a minimum path. Therefore, there may be a phase difference between data, which is transmitted from the FIFO memory 520 to the data multiplexer 560, and the select clock signal SEL_CLK. When there is such a phase difference under a fast clock speed, a data valid window may not be secured. One way a data valid window may be secured is by compensating for a phase difference between data output from the FIFO memory 520 and the select clock signal SEL_CLK of the data multiplexer 560. In an embodiment of the inventive concept, a "fast clock speed" may be about 10% faster than a conventional clock speed. In another embodiment of the inventive concept, a "fast clock speed" may be about 20% faster than a conventional clock speed. In still another embodiment of the inventive concept, a "fast clock speed" may be a speed 25% or more faster than a conventional clock speed.

The serial pipeline structure 540 may compensate for the phase difference between the data output from the FIFO memory 520 and the select clock signal SEL_CLK of the data multiplexer 560. The serial pipeline structure 540 may include k serial pipelines 542_1 through 542_k (k is a natural number greater than or equal to 2). The serial pipelines 542_1 through 542_k may operate in response to serial pipeline driving clock signals SCLK_1 through SCLK_k, respectively. Phases of the serial pipeline driving clock signals SCLK_1 through SCLK_k may become faster from the FIFO memory 520 to the data multiplexer 560. For example, a first serial pipeline driving clock signal SCLK_1 may have the same phase, as or a slightly faster phase, than the FIFO output clock signal FOCLK_1 through FOCLK_n, and a k-th serial pipeline driving clock signal SCLK_k may have the same phase, or a slightly slower phase than, the select clock signal SEL_CLK. Accordingly, the phase of data output from the FIFO memory 520 may become gradually faster as the phase of data is being transmitted through the serial pipelines 542_1 through 542_k, and data finally output from the serial pipeline structure 540 may have the same phase as the select clock signal SEL_CLK.

A serial pipeline driving clock signal (SCLK) generator 550 may generate the plurality of serial pipeline driving clock signals SCLK_1 through SCLK_k. The SCLK generator 550 may generate the plurality of serial pipeline driving clock signals SCLK_1 through SCLK_k from a signal of an internal clock (e.g., ICLK in FIG. 4). However, embodiments of the inventive concept are not limited thereto, and the plurality of serial pipeline driving clock signals SCLK_1 through SCLK_k may be generated from the select clock signal SEL_CLK of the data multiplexer 560, for example. The phases of the serial pipeline driving clock signals SCLK_1 through SCLK_k generated by the SCLK generator 550 may be gradually delayed in the order from the k-th serial pipeline driving clock signal SCLK_k to the first serial pipeline driving clock signal SCLK_1. The SCLK generator 550 may include a plurality of phase delay elements. The SCLK generator 550 may be described in more detail with reference to FIG. 4.

The data multiplexer 560 may selectively output data, which is transmitted as parallel data, to the input/output pad DQ[i] in response to the select clock signal SEL_CLK. The select clock signal SEL_CLK may be generated from the internal clock signal ICLK and, since the select clock signal SEL_CLK of the data multiplexer 560 is directly related to the jitter characteristic of a non-volatile memory device, a path through which the select clock signal SEL_CLK is transmitted may be designed as a minimum path. Moreover, the data multiplexer 560 may be referred to as a serializer.

Figure 3:
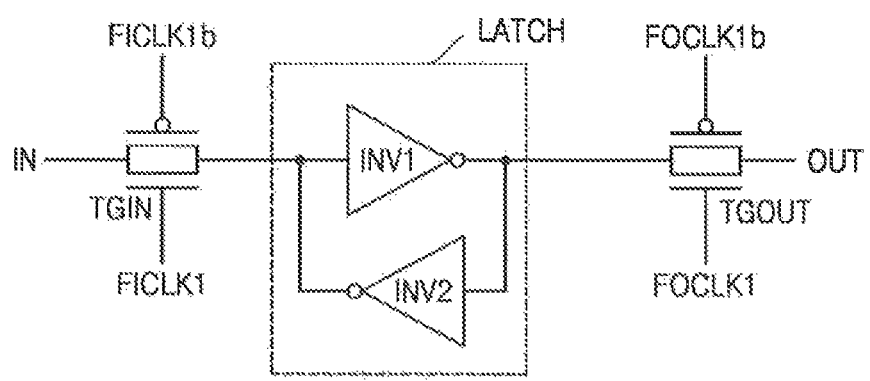
FIG. 3 is a diagram showing a register in a First In, First Out (FIFO) memory according to an example embodiment of the inventive concept.

FIG. 3 is a diagram illustrating a register in a FIFO memory according to an example embodiment of the inventive.

The register may include an input trans-gate circuit TGIN, an output trans-gate circuit TGOUT, and a latch LATCH. The latch LATCH may include a first inverter INV1 and a second inverter INV2. The input trans-gate circuit TGIN may latch data input through a data line to the latch LATCH based on first FIFO input clock signals FICLK1 and FICLK1*b*. The output trans-gate circuit TGIN may output the data latched to the latch LATCH to a data pad based on first FIFO output clock signals FOCLK1 and FOCLK1*b*. The registers REG_1 through REG_n shown in FIG. 2 may be implemented in the same manner as the register described above.

Figure 4:
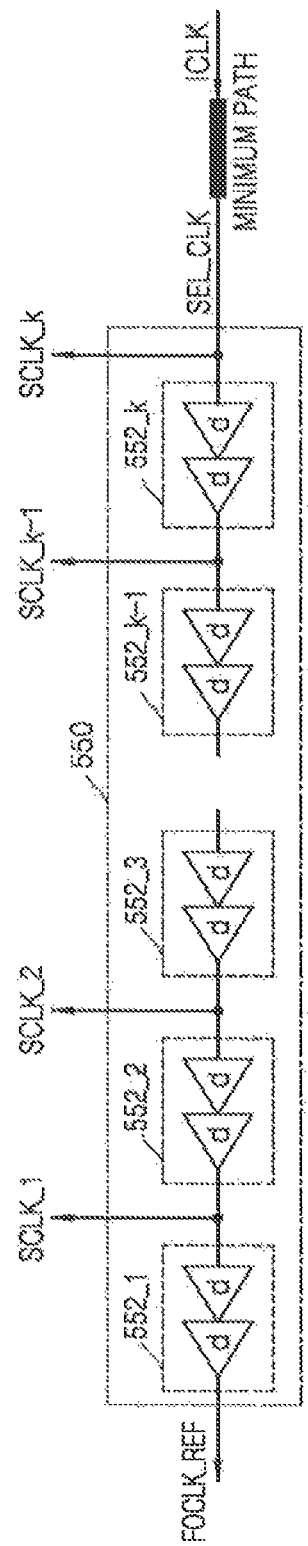
FIG. 4 is a diagram showing a serial pipeline driving clock generator according to an example embodiment of the inventive concept.

FIG. 4 is a diagram showing the SCLK generator 550 according to an example embodiment of the inventive concept.

As described above with reference to FIG. 2, the SCLK generator 550 may generate the plurality of serial pipeline driving clock signals SCLK_1 through SCLK_k from the internal clock signal ICLK. Furthermore, referring to FIG. 4, the SCLK generator 550 may generate the plurality of serial pipeline driving clock signals SCLK_1 through SCLK_k from the select clock signal SEL_CLK. Since the select clock signal SEL_CLK of the data multiplexer 560 is directly related to the jitter characteristic of a non-volatile memory device, a path through which the select clock signal SEL_CLK is transmitted may be designed as a minimum path.

The phases of the serial pipeline driving clock signals SCLK_1 through SCLK_k may be delayed in the order from the k-th serial pipeline driving clock signal SCLK_k to the first serial pipeline driving clock signal SCLK_1. For example, the first serial pipeline driving clock signal SCLK_1 may have the same phase, or a slightly faster phase, than data output from a previous FIFO memory. The k-th serial pipeline driving clock signal SCLK_k may have the same phase, or a slightly slower phase, than the select clock signal SEL_CLK. The SCLK generator 550 may include a plurality of phase delay elements 552_1 through 552_k. Each of the phase delay elements 552_1 through 552_k may delay the phase of an input clock signal and output a delayed clock signal.

The k-th serial pipeline driving clock signal SCLK_k generated by the SCLK generator 550 may have a same phase as the select clock signal SEL_CLK. However, the inventive concept is not limited thereto. In another example, the k-th serial pipeline driving clock signal SCLK_k may be a signal generated by slightly delaying the phase of the select clock signal SEL_CLK. A k-th phase delay element 552_k may generate a k−1th serial pipeline driving clock signal SCLK_k−1 by slightly delaying the k-th serial pipeline driving clock signal SCLK_k. Similarly, the first serial pipeline driving clock signal SCLK_1 may be generated by slightly delaying a second serial pipeline driving clock signal SCLK_2. Furthermore, for example, the SCLK generator 550 may generate a FIFO output clock reference signal FOCLK_REF having the same phase as a FIFO output clock signal by slightly delaying the first serial pipeline driving clock signal SCLK_1. The FIFO output clock reference signal FOCLK_REF may be described with reference to FIG. 8B.

Since the SCLK generator 550 delays the phase in the order from the k-th serial pipeline driving clock signal SCLK_k to the first serial pipeline driving clock signal SCLK_1, phases of the serial pipeline driving clock signals SCLK_1 through SCLK_k may become faster in the order from the first serial pipeline driving clock signal SCLK_1 to the k-th serial pipeline driving clock signal SCLK_k. Therefore, the phase of data transmitted through serial pipelines may become identical to by the phase of a select clock signal of a data multiplexer.

Figure 5:
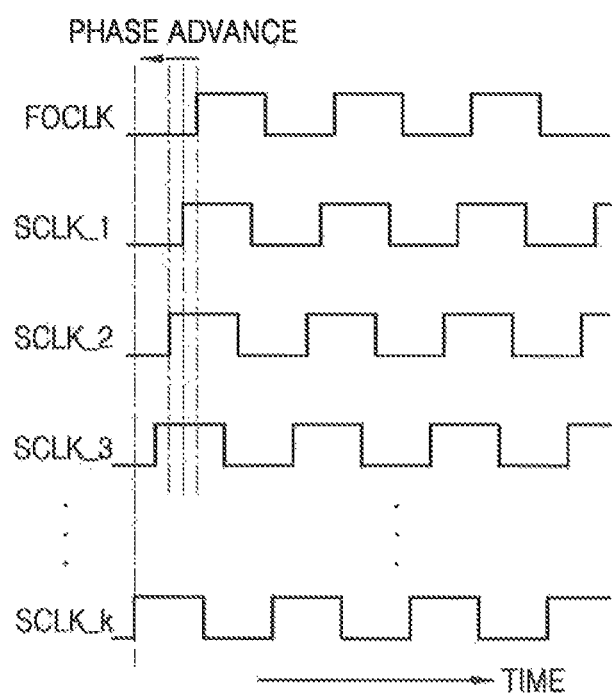
FIG. 5 is a timing diagram of a serial pipeline driving clock signal according to an example embodiment of the inventive concept.

FIG. 5 is a timing diagram of a serial pipeline driving clock signal according to an example embodiment of the inventive concept.

Referring to FIGS. 4 and 5, the k-th serial pipeline driving clock signal SCLK_k may be a signal whose phase is the same as or slightly delayed from that of the select clock signal SEL_CLK. A serial pipeline driving clock signal generator may include a plurality of phase delay elements, and the plurality of phase delay elements may delay the phase of serial pipeline driving clock signals progressively. As a result, the first serial pipeline driving clock signal SCLK_1 may have the same phase, or a slightly faster phase, than the FIFO output clock signal FOCLK. Referring back to FIG. 5, the phases of the serial pipeline driving clock signals SCLK_1 through SCLK_k may be delayed in the order from the k-th serial pipeline driving clock signal SCLK_k to the first serial pipeline driving clock signal SCLK_1. In other words, the phase may become faster in the order from the first serial pipeline driving clock signal SCLK_1 to the k-th serial pipeline driving clock signal SCLK_k. The first serial pipeline driving clock signal SCLK_1 may have a slightly faster phase than the FIFO output clock signal FOCLK. The change of the phase of data due to such phase changes may be described with reference to FIGS. 6 and 7.

Figure 6:
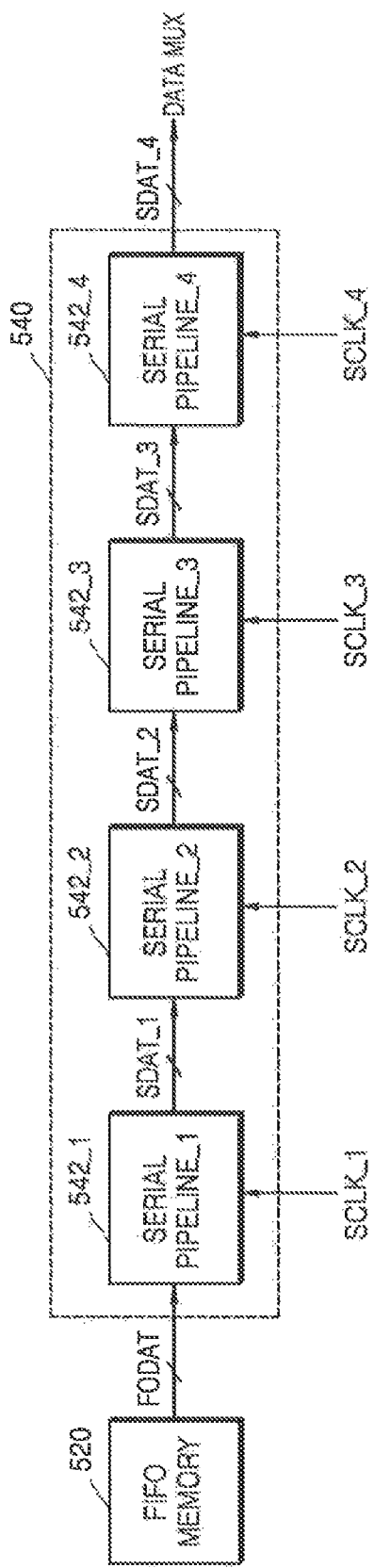
FIG. 6 is a diagram showing an output buffer circuit according to an example embodiment of the inventive concept.

FIG. 6 is a diagram showing an output buffer circuit according to an example embodiment of the inventive concept.

For the convenience of explanation, a flow of data output from one data line will be described. Data output from a data line is input sequentially to the FIFO memory 520 based on a plurality of FIFO input clock signals and the FIFO memory 520 sequentially outputs data based on a plurality of FIFO output clock signals. The data output from the FIFO memory 520 may be referred to as FIFO output data FODAT. The FIFO output data FODAT may be input to the serial pipeline structure 540. The serial pipeline structure 540 may include four serial pipeline structures 542_1 through 542_4. The number of serial pipelines is not limited thereto, and the serial pipeline structure 540 may include k serial pipelines (k is a natural number greater than or equal to 2).

The FIFO output data FODAT may be input to a first serial pipeline 542_1. The first serial pipeline 542_1 may output input data in response to the first serial pipeline driving clock signal SCLK_1. The data output from the first serial pipeline 542_1 may be referred to as first serial pipeline data SDAT_1. The first serial pipeline data SDAT_1 may be input to a second serial pipeline 542_2. The second serial pipeline 542_2 may output input data in response to the second serial pipeline driving clock signal SCLK_2. Data output from the second serial pipeline 542_2 may be referred to as second serial pipeline data SDAT_2. In the same regard, data output from a third serial pipeline 542_3 may be referred to as third serial pipeline data SDAT_3, and data output from a fourth serial pipeline 542_4 may be referred to as fourth serial pipeline data SDAT_4. The fourth serial pipeline data SDAT_4 may be input to a data multiplexer and transmitted to an input/output pad in response to the select clock signal SEL_CLK. The timing chart of the FIFO output data and a plurality of serial pipeline data SDAT_1 through SDAT_4 may be described with reference to FIG. 7.

Figure 7:
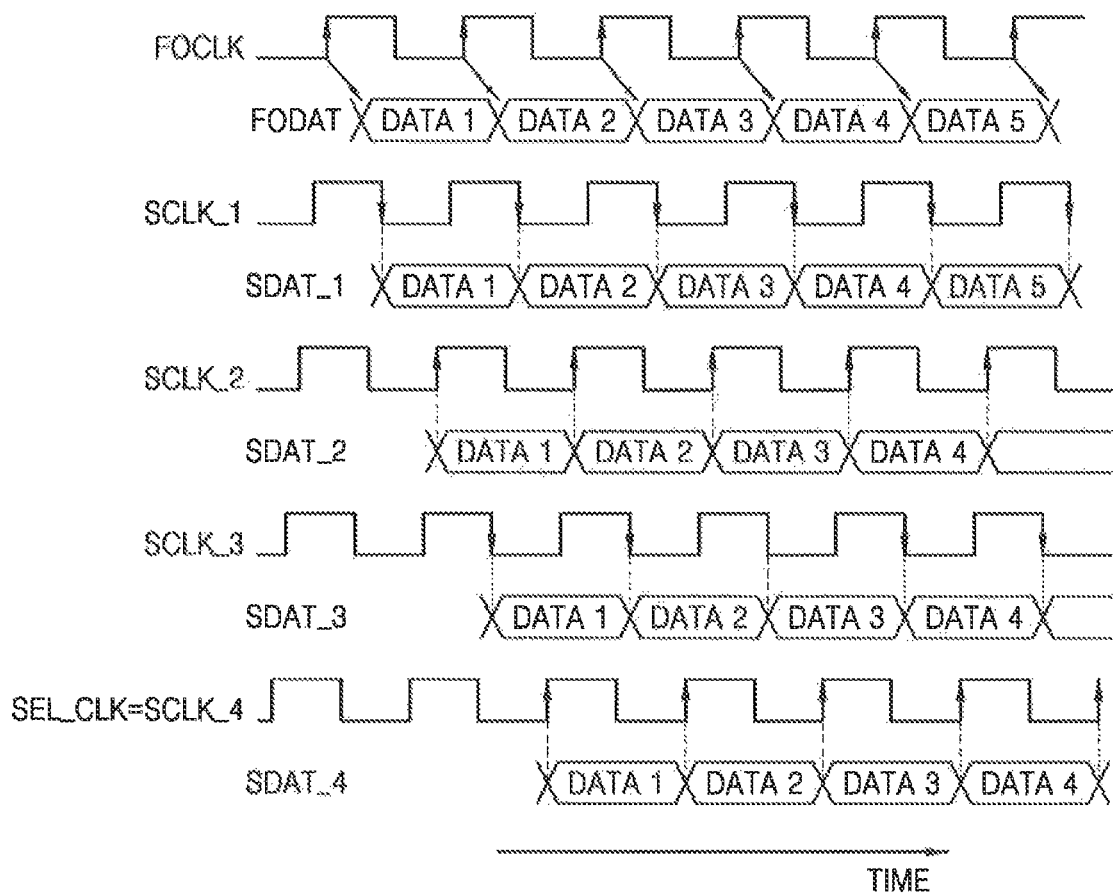
FIG. 7 is a timing diagram of data according to an example embodiment of the inventive concept.

FIG. 7 is a timing diagram of data according to an example embodiment of the inventive concept.

The FIFO output data FODAT may be output from a FIFO memory in response to the FIFO output clock signal FOCLK. For example, the FIFO memory may sequentially output the FIFO output data FODAT in response to the rising edge of the FIFO output clock signal FOCLK. Referring to FIG. 7, in response to the rising edge of the FIFO output clock signal FOCLK, DATA1, DATA2, DATA3, DATA4, DATA5, and so on may be output as FIFO output data FODAT. The FIFO output data FODAT may have a delayed phase as compared to the select clock signal SEL_CLK.

A first serial pipeline may output the first serial pipeline data SDAT_1 in response to the first serial pipeline driving clock signal SCLK_1. For example, the first serial pipeline may output the first serial pipeline data SDAT_1 in response to the falling edge of the first serial pipeline driving clock signal SCLK_1. Referring to FIG. 7, in response to the falling edge of the first serial pipeline driving clock signal SCLK_1, DATA1, DATA2, DATA3, DATA4, DATA5, and so on may be output as the first serial pipeline data SDAT_1.

A second serial pipeline may output the second serial pipeline data SDAT_2 in response to the second serial pipeline driving clock signal SCLK_2. For example, the second serial pipeline may output the second serial pipeline data SDAT_2 in response to the rising edge of the second serial pipeline driving clock signal SCLK_2. Referring to FIG. 7, in response to the rising edge of the second serial pipeline driving clock signal SCLK_2, DATA1, DATA2, DATA3, DATA4, DATA5, and so on may be output as the second serial pipeline data SDAT_2.

A third serial pipeline may output the third serial pipeline data SDAT_3 in response to a third serial pipeline driving clock signal SCLK_3. For example, the third serial pipeline may output the third serial pipeline data SDAT_3 in response to the falling edge of the third serial pipeline driving clock signal SCLK_3. Referring to FIG. 7, in response to the rising edge of the third serial pipeline driving clock signal SCLK_3, DATA1, DATA2, DATA3, DATA4, DATA5, and so on may be output as the third serial pipeline data SDAT_3.

A fourth serial pipeline may output the fourth serial pipeline data SDAT_4 in response to a fourth serial pipeline driving clock signal SCLK_4. For example, the fourth serial pipeline may output a fourth serial pipeline data SDAT_4 in response to the rising edge of the fourth serial pipeline driving clock signal SCLK_4. Referring to FIG. 7, in response to the rising edge of the fourth serial pipeline driving clock signal SCLK_4, DATA1, DATA2, DATA3, DATA4, DATA5, and so on may be output as the fourth serial pipeline data SDAT_4.

The fourth serial pipeline driving clock signal SCLK_4 may have the same phase as the select clock signal SEL_CLK of a data multiplexer. Therefore, the fourth serial pipeline data SDAT_4 finally output from the serial pipelines may have the same phase as the select clock signal SEL_CLK. Since there is no phase difference between the fourth serial pipeline data SDAT_4 and the select clock signal SEL_CLK, a data valid window may be secured to increase the clock speed of a non-volatile memory device, thereby facilitating high-speed operation of the non-volatile memory device.

Figure 8A:
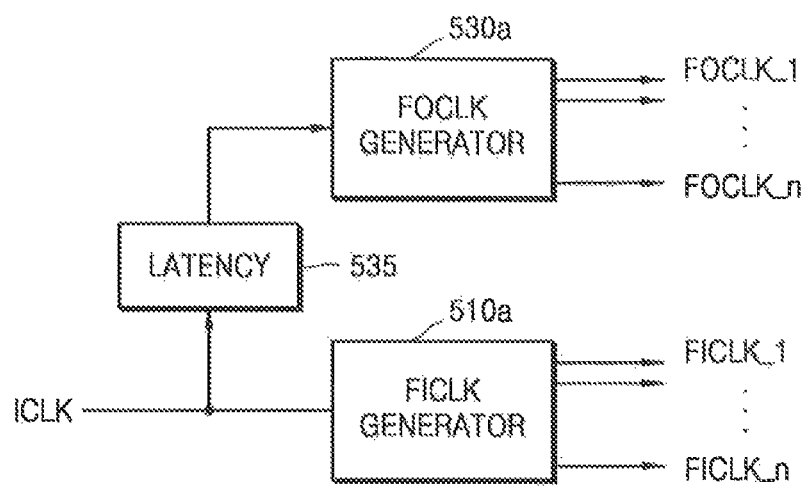
FIGS. 8A and 8B are diagrams showing FIFO input clock generators and FIFO output clock generators, according to an example embodiment of the inventive concept.
Figure 8B:
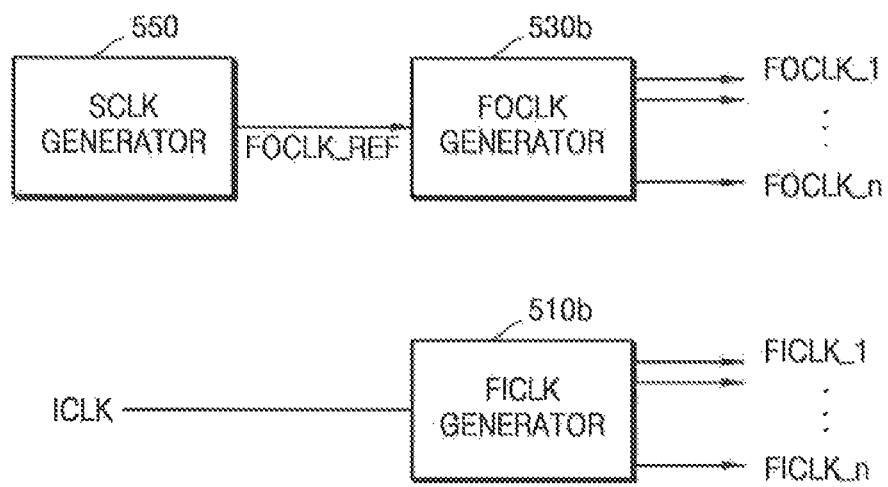

FIGS. 8A and 8B are diagrams showing FIFO input clock generators 510a and 510b and FIFO output clock generators 530a and 530b, according to an example embodiment of the inventive concept.

Referring to FIG. 8A, the FIFO input clock generator 510a may generate the plurality of FIFO input clock signals FICLK_1 through FICLK_n (n is a natural number) by using the internal clock signal ICLK. The internal clock signal ICLK may be an external clock signal input from the outside (a memory controller) and may be a signal generated by an oscillator in a non-volatile memory device. For example, the internal clock signal ICLK may be a read enable signal input from a memory controller. The FIFO output clock generator 530a may generate the plurality of FIFO output clock signals FOCLK_1 through FOCLK_n to have a pre-set latency by using the internal clock signal ICLK. The plurality of FIFO output clock signals FOCLK_1 through FOCLK_n may have a latency corresponding to a propagation delay as compared to the plurality of FIFO input clock signals FICLK_1 through FICLK_n.

Referring to FIG. 8B, the FIFO input clock generator 510b may generate the plurality of FIFO input clock signals FICLK_1 through FICLK_n (n is a natural number) by using the internal clock signal ICLK. The internal clock signal ICLK may be an external clock signal input from the outside (a memory controller) and may be a signal generated by an oscillator in a non-volatile memory device. The FIFO output clock generator 530b may receive the FIFO output clock reference signal FOCLK_REF from the SCLK generator 550 and generate the plurality of FIFO output clock signals FOCLK_1 through FOCLK_n from the FIFO output clock reference signal FOCLK_REF. The FIFO output clock reference signal FOCLK_REF may have the same phase, or a slightly delayed phase, than the first serial pipeline driving clock signal SCLK_1.

Referring to FIGS. 8A and 8B, the plurality of FIFO input clock signals FICLK_1 through FICLK_n generated by the FIFO input clock generators 510a and 510b may be input to the FIFO memory, such that the FIFO memory sequentially receives data. The plurality of FIFO output clock signals FOCLK_1 through FOCLK_n generated by the FIFO output clock generators 530a and 530b may be input to the FIFO memory, such that the FIFO memory sequentially outputs data.

Figure 9:
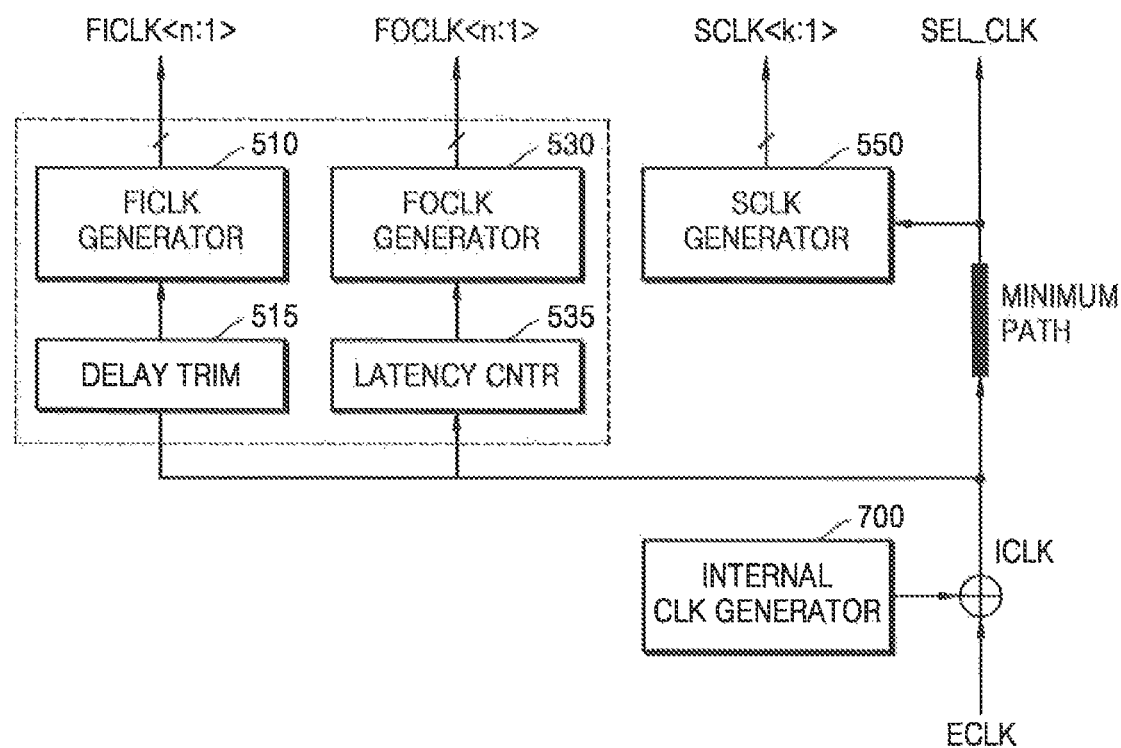
FIG. 9 is a diagram showing various clock signal generation processes according to an example embodiment of the inventive concept.

FIG. 9 is a diagram showing various clock signal generation processes according to an example embodiment of the inventive concept.

A non-volatile memory device may include an internal clock generator 700. The internal clock signal ICLK may be generated from a clock signal generated by the internal clock generator 700. The internal clock generator 700 may generate an internal clock signal delayed by the latency of an entire pipeline structure. Furthermore, the internal clock signal ICLK may be generated by referring to a clock signal generated by the internal clock generator 700 and an external clock signal ECLK. As the non-volatile memory device includes the internal clock generator 700, pipeline latency may not be seen from the outside.

The internal clock signal ICLK may be finely adjusted by a delay trim circuit 515 and input to a FIFO input clock generator 510. The FIFO input clock generator 510 may generate a plurality of FIFO input clock signals FICLK<n:1> from the finely-adjusted internal clock signal ICLK. In an embodiment of the inventive concept, the term "finely adjusted" may be less than about a 10% adjustment of the internal clock signal. In another embodiment of the inventive concept, the term "finely adjusted" may be less than about a 5% adjustment of the internal clock signal. In another embodiment of the inventive concept, the term "finely adjusted" may be less than about a 3% adjustment of the internal clock signal. In still another embodiment of the inventive concept, the term "finely adjusted" may be less than about a 1% adjustment of the internal clock signal.

A non-volatile memory device may include a latency counter 535. The latency counter 535 may count the internal clock signal ICLK a predetermined number of times and then transmit the internal clock signal ICLK to the FIFO output clock generator 530. The latency counted by the latency counter 535 may be a latency corresponding to a propagation delay.

Since the select clock signal SEL_CLK of a data multiplexer connected to a data input/output pad is directly related to the jitter characteristic of a non-volatile memory device, a path through which the select clock signal SEL_CLK is transmitted may be designed as a minimum path. The SCLK generator 550 may generate a plurality of serial pipeline driving clock signals SCLK<k:1> from the internal clock signal ICLK or the select clock signal SEL_CLK. The SCLK generator 550 may be described in detail with reference to FIG. 4.

Figure 10:
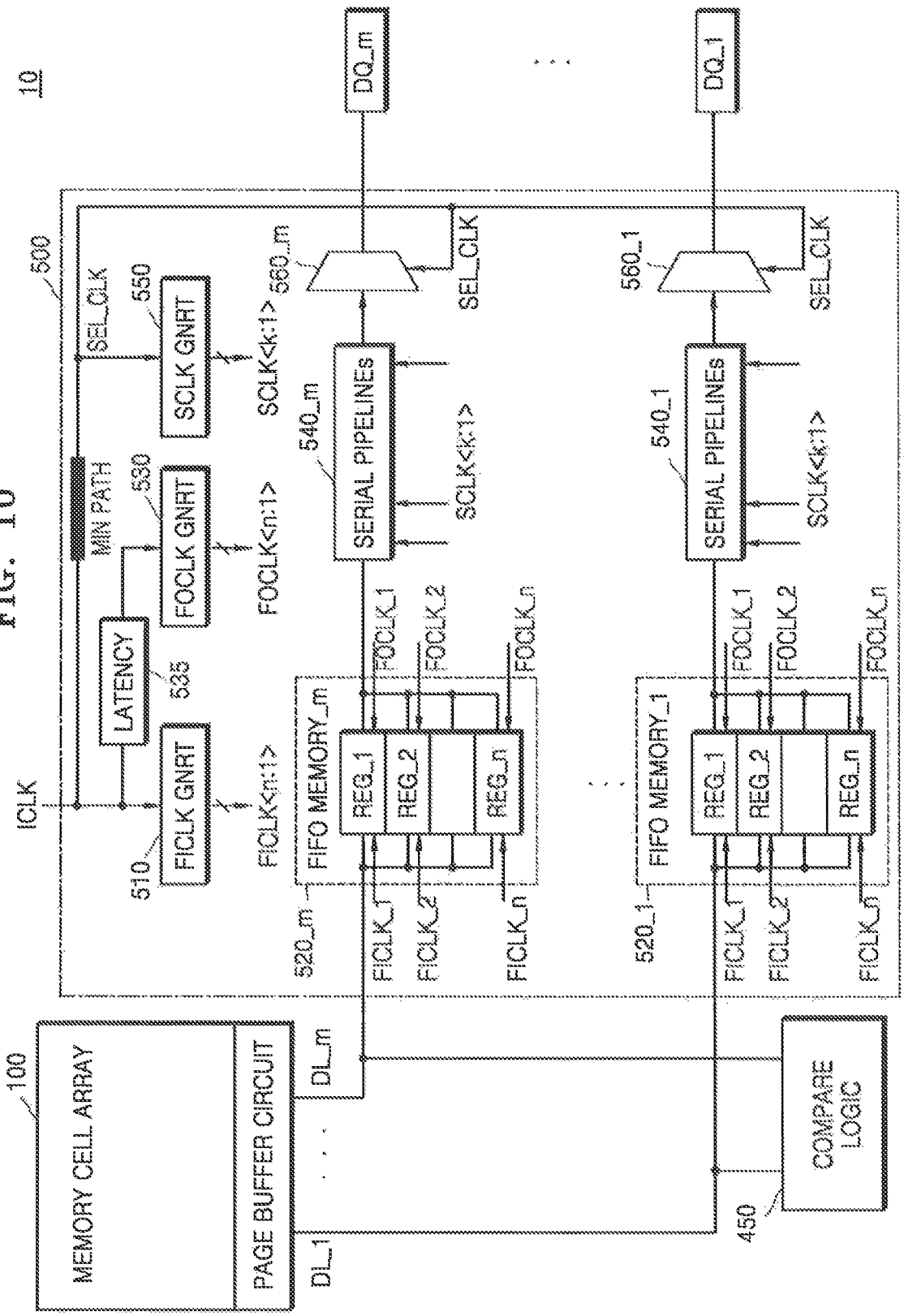
FIG. 10 is a diagram showing a non-volatile memory device according to an example embodiment of the inventive concept.

FIG. 10 is a diagram showing the non-volatile memory device 10 according to an example embodiment of the inventive concept.

The non-volatile memory device 10 may include the memory cell array 100, the page buffer circuit 400 for temporarily storing page data of the memory cell array 100, and the output buffer circuit 500 and may further include a compare logic 450. The non-volatile memory device 10 may include a plurality of page buffer circuits 400. The page buffer circuits 400 may be connected to the output buffer circuit 500 through m data lines DL_1 through DL_m (m is a natural number). In a data read mode, the output buffer circuit 500 may read data from the page buffer circuit 400 through the data lines DL_1 through DL_m.

The compare logic 450 may be connected to the data lines DL_1 through DL_m. The compare logic 450 may compare data transmitted through the data lines DL_1 through DL_m to ensure data integrity in a data read operation. Referring to FIG. 10, the compare logic 450 checks the integrity of data transmitted through all the data lines DL_1 through DL_m. However, the inventive concept is not limited thereto. For example, the compare logic 450 may check the integrity of data transmitted to at least one of the data lines DL_1 through DL_m.

The output buffer circuit 500 may include hybrid pipeline structures respectively connected to the data lines DL_1 through DL_m. The hybrid pipeline structures may include FIFO memories 520_1 through 520_m and serial pipeline structures 540_1 through 540_m, respectively. The output buffer circuit 500 may include data multiplexers 560_1 through 560_m respectively connected to data input/output pads DQ_1 through DQ_m. The FIFO memories 520_1 through 520_m may include n registers REG_1 through REG_n (n is a natural number), respectively. The registers REG_1 through REG_n may receive data transmitted through the data lines DL1 through DL_m based on the plurality of FIFO input clock signals FICLK_1 through FICLK_n, respectively, and may transmit data to the serial pipeline structures 540_1 through 540_m based on the plurality of FIFO output clock signals FOCLK_1 through FOCLK_n, respectively. Each of the serial pipeline structures 540_1 through 540_m may include a plurality of serial pipelines operating in response to a plurality of serial pipeline driving clock signals SCLK<k:1>. Phases of data output from the FIFO memories 520_1 through 520_m may be adjusted as the data is transmitted through the serial pipeline structures 540_1 through 540_m operated by the plurality of serial pipeline driving clock signals SCLK<k:1>. The data transmitted through the serial pipeline structures 540_1 through 540_m may be transmitted to the data input/output pad DQ_1 through DQ_m through the data multiplexers 560_1 through 560_m, respectively.

The output buffer circuit 500 may include the FIFO input clock generator 510, the FIFO output clock generator 530, and the SCLK generator 550. The mechanism that the FIFO input clock generator 510, the FIFO output clock generator 530 and the SCLK generator 550 generate various clock signals may be described with reference to FIG. 9.

Since the output buffer circuit 500 includes a hybrid pipeline structure including the FIFO memories 520_1 through 520_m and the serial pipelines 540_1 through 540_m, the output buffer circuit 500 may sequentially receive and output data. As a phase difference between the output data and select clock signals SEL_CLK of the data multiplexers 560_1 through 560_m is eliminated, high-speed operation of the non-volatile memory device 10 may be facilitated without a phase difference having a detrimental impact on the operation of the storage device. One non-limiting example of a high-speed operation, according to an embodiment of the inventive concept, may be read operations at about 1200-2500 MBps. Other embodiments of the inventive concept may have different ranges for what is considered a high-speed operation versus a low-speed operation.

Figure 11:
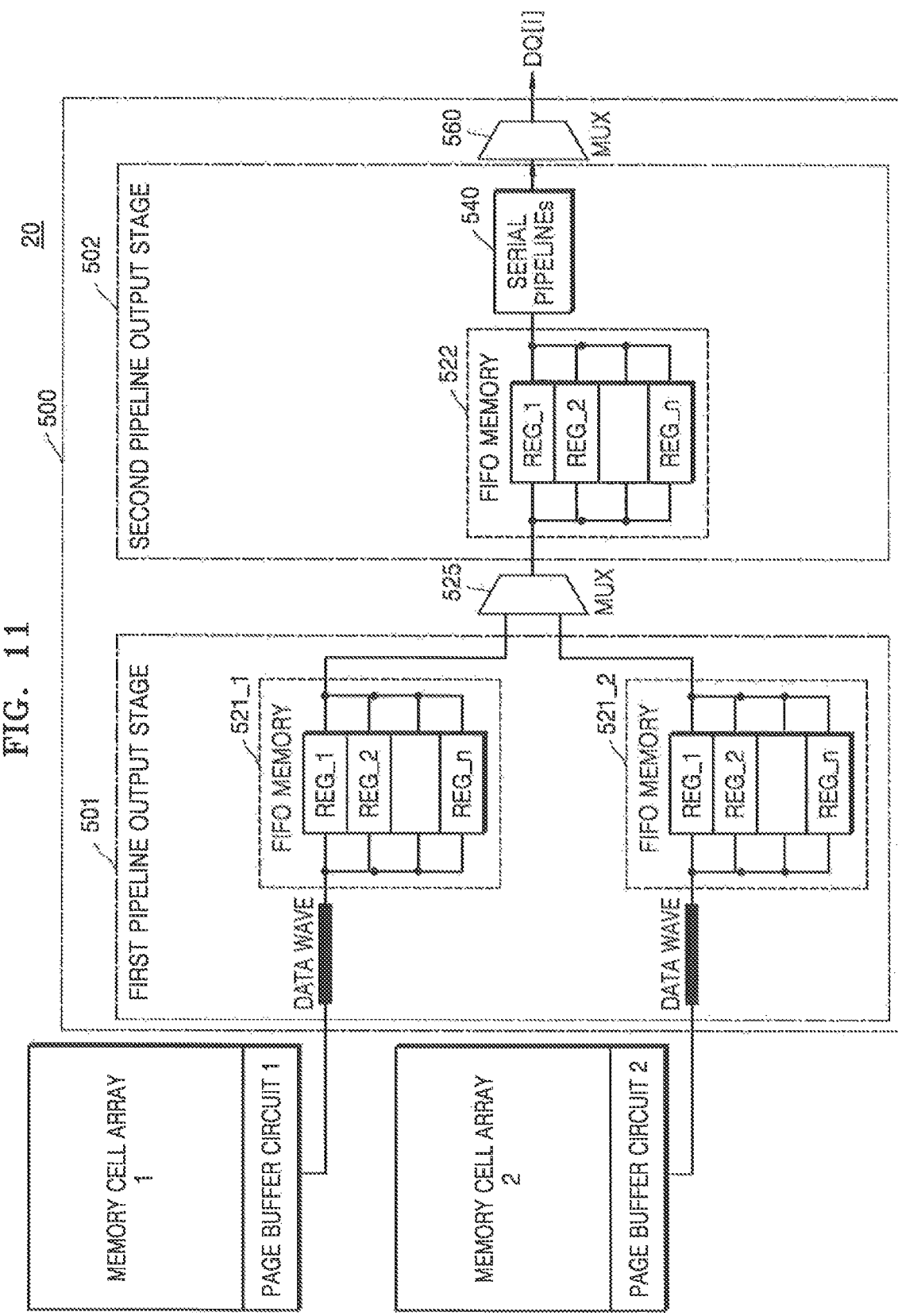
FIG. 11 is a diagram showing a non-volatile memory device according to an example embodiment of the inventive concept.

FIG. 11 is a diagram showing a non-volatile memory device 20 according to an example embodiment of the inventive concept.

The non-volatile memory device 20 may include, for example, the output buffer circuit 500 including a plurality of memory cell arrays and a plurality of pipeline output stages 501 and 502. For example, the non-volatile memory device 20 may include two memory cell arrays and the output buffer circuit 500 may include a first pipeline output stage 501 and a second pipeline output stage 502.

For the convenience of explanation, a path of data read through an i-th data line connected to a page buffer circuit will be described. Data may be read from each memory cell array according to a data read command. Data output from each data page buffer circuit through a data line may be transmitted to the first pipeline output stage 501. The first pipeline output stage 501 may include only a wave pipeline structure and may include FIFO memories 521_1 and 521_2. Data transmitted to the first pipeline output stage 501 may be sequentially inputted to the FIFO memories 521_1 and 521_2 based on a plurality of FIFO input clock signals through data paths having a wave pipeline structure and may be sequentially output from the FIFO memories 521_1 and 521_2 based on a plurality of FIFO output clock signals.

Data output from the first pipeline output stage 501 may be selected by a first data multiplexer 525 and transmitted to the second pipeline output stage 502.

The second pipeline output stage 502 may include a hybrid pipeline structure, which is a combination of a wave pipeline structure and a serial pipeline structure. The second pipeline output stage 502 may include a FIFO memory 522 and the serial pipeline structure 540. The serial pipeline structure 540 may include a plurality of serial pipelines. The data transmitted to the second pipeline output stage 502 may be sequentially inputted to the FIFO memory 522 based on a plurality of FIFO input clock signals and may be sequentially output from the FIFO memory 522 based on a plurality of FIFO output clock signals. The data output from the FIFO memory 522 may be transmitted to a second data multiplexer 560 through the serial pipeline structure 540. The phase of data output from the FIFO memory 522 may become gradually faster as the data is being transmitted through the serial pipeline structure 540 and data finally output from the serial pipeline structure 540 may have the same phase as a select clock of the second data multiplexer 560.

Data output from the second pipeline output stage 502 may be transmitted to the data input/output pad DQ[i] through the second data multiplexer 560. Since the non-volatile memory device 20 includes a hybrid pipeline structure, the non-volatile memory device 20 may operate in a high-speed operating mode. However, the configuration of the non-volatile memory device 20 including a hybrid pipeline structure as described herein is not limited thereto. For example, only the first pipeline output stage 501 may include a hybrid pipeline structure or both first pipeline output stage 501 and second pipeline output stage 502 may include hybrid pipeline structures.

Figure 12A:
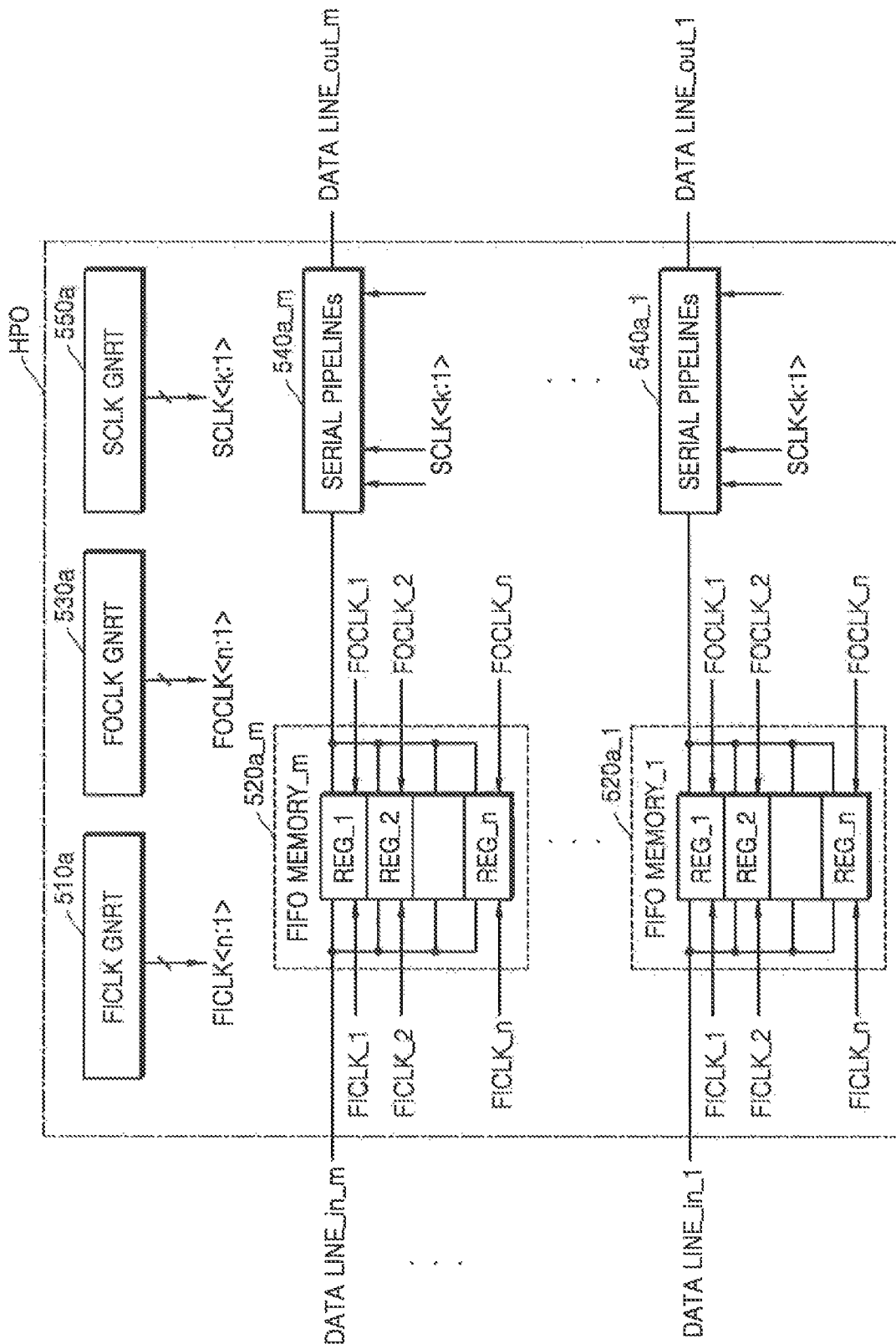
FIG. 12A is a diagram showing a hybrid pipeline output stage according to an example embodiment of the inventive concept.

FIG. 12A is a diagram showing a hybrid pipeline output stage HPO according to an example embodiment of the inventive concept.

To describe the non-volatile memory device of FIGS. 13 through 16, a hybrid pipeline output stage HPO as shown in FIG. 12A may be modularized. The hybrid pipeline output stage HPO may receive data through m data input lines DATA LINE_in_1 through DATA LINE_in_m (m is a natural number), and data may be output through m data output lines DATA LINE_out_1 through DATA LINE_out_m.

Data input to the hybrid pipeline output stage HPO through the data input lines DATA LINE_in_1 through DATA LINE_in_m may be transmitted through a hybrid pipeline structure including FIFO memories 520a_1 through 520a_m and serial pipeline structures 540a_1 through 5401_m and output through the data output lines DATA LINE_out_1 through DATA LINE_out_m.

Each of the FIFO memories 520a_1 through 520a_m may include n registers REG_1 through REG_n. The FIFO memories 520a_1 through 520a_m may sequentially receive data based on the plurality of FIFO input clock signals FICLK_1 through FICLK_n and sequentially output data based on the plurality of FIFO output clock signals FOCLK_1 through FOCLK_n. The hybrid pipeline output stage HPO may include the FIFO input clock generator 510a for generating the plurality of FIFO input clock signals FICLK_1 through FICLK_n and the FIFO output clock generator 530a for generating the plurality of FIFO output clock signals FOCLK_1 through FOCLK_n. It may be understood for illustrative purposes that the operations of the FIFO memories 520a_1 through 520a_m, the FIFO input clock generator 510a, and the FIFO output clock generator 530a are identical to those described above with reference to FIGS. 1 through 9.

Each of the serial pipeline structure 540a_1 through 540a_m may include a plurality of serial pipelines, and each serial pipeline may operate in response to a serial pipeline driving clock signal SCLK<k:1>. The hybrid pipeline output stage HPO may include an SCLK generator 550a generating the plurality of serial pipeline driving clock signals SCLK<k:1>. Phases of data output from the FIFO memories 520a_1 through 420a_m may become faster as the data is being transmitted through the serial pipeline structures 540a_1 through 540a_m and the final output data may have the same phase as a select clock signal of a connected data multiplexer. It may be understood that the operations of the serial pipeline structure 540a_1 through 540a_m and the SCLK generator 550a are identical to those described above with reference to FIGS. 1 through 9.

Figure 12B:
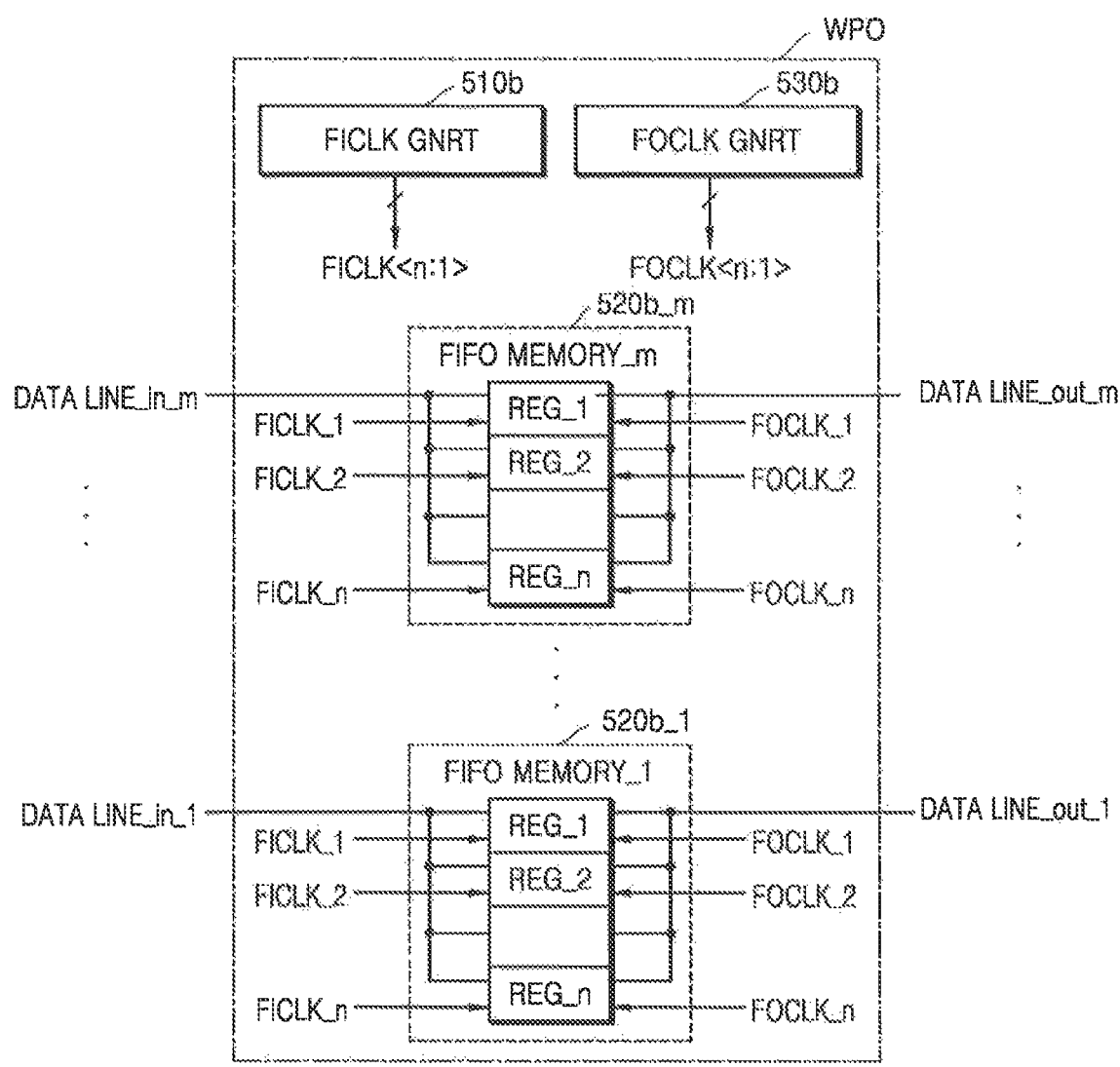
FIG. 12B is a diagram showing a wave pipeline output stage according to an example embodiment of the inventive concept.

FIG. 12B is a diagram showing a wave pipeline output stage WPO according to an example embodiment of the inventive concept.

In the description of the non-volatile memory device of FIGS. 13 through 16, the wave pipeline output stage WPO as shown in FIG. 12B may be modularized. The wave pipeline output stage WPO may receive data through m data input lines DATA LINE_in_1 through DATA LINE_in_m (m is a natural number) and output data through m data output lines DATA LINE_out_1 through DATA LINE_out_m.

Data input through the data input lines DATA LINE_in_1 through DATA LINE_1_m to the wave pipeline output stage WPO may be transmitted through FIFO memories 520b_1 through 520b_m and output through the data output lines DATA LINE_out_1 through DATA LINE_out_m.

Each of the FIFO memories 520b_1 through 520b_m may include n registers REG_1 through REG_n. The FIFO memories 520b_1 through 520b_m may sequentially receive data based on the plurality of FIFO input clock signals FICLK_1 through FICLK_n and sequentially output data based on the plurality of FIFO output clock signals FOCLK_1 through FOCLK_n. The wave pipeline output stage WPO may include the FIFO input clock generator 510b for generating the plurality of FIFO input clock signals FICLK_1 through FICLK_n and the FIFO output clock generator 530b for generating the plurality of FIFO output clock signals FOCLK_1 through FOCLK_n. It may be understood that the operations of the FIFO memories 520b_1 through 520b_m, the FIFO input clock generator 510b, and the FIFO output clock generator 530b are identical to those described above with reference to FIGS. 1 through 9.

Figure 13:
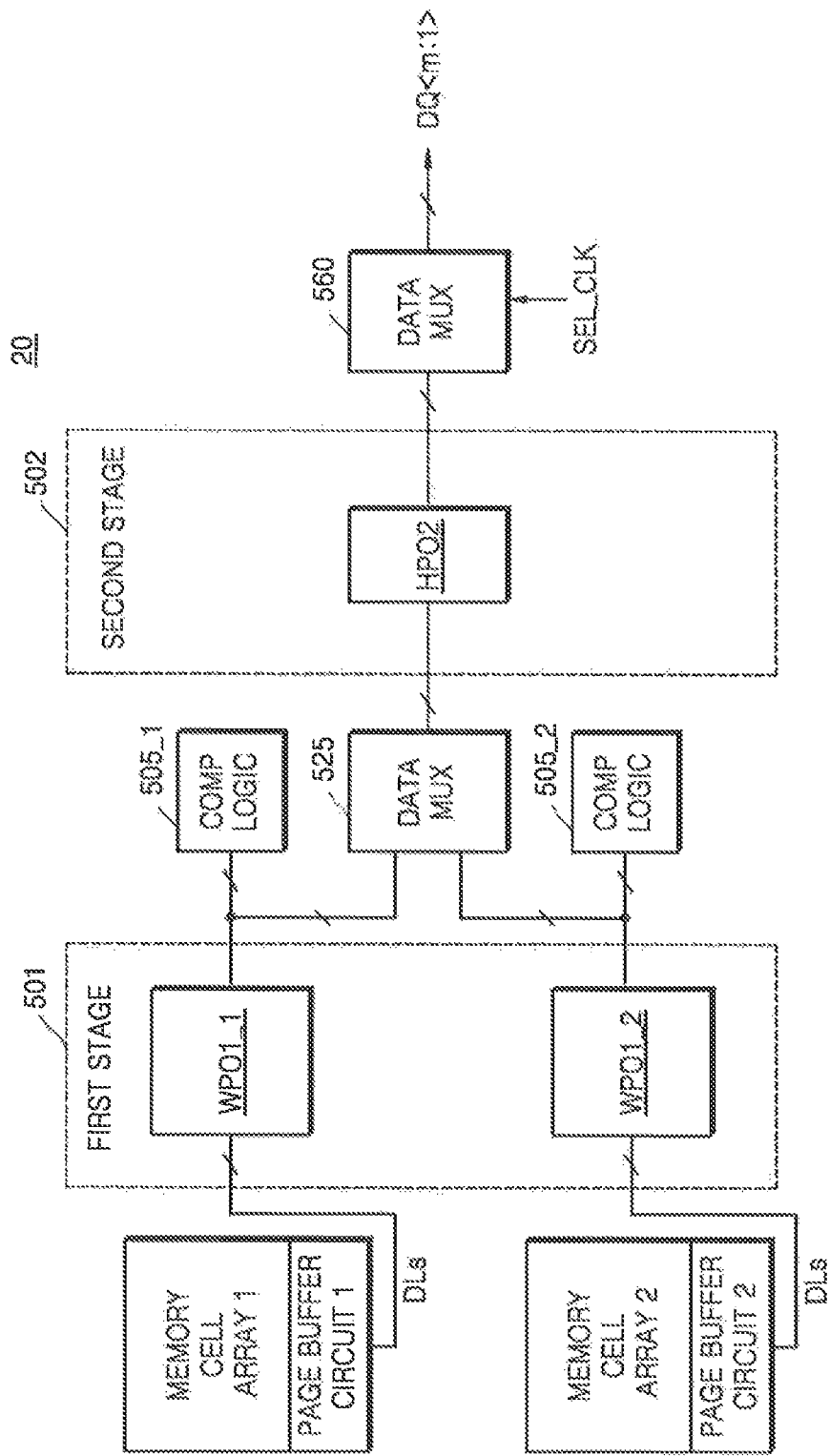
FIG. 13 is a diagram showing a non-volatile memory device according to an example embodiment of the inventive concept.

FIG. 13 is a diagram showing the non-volatile memory device 20 according to an example embodiment of the inventive concept.

The non-volatile memory device 20 may include two memory cell arrays, page buffer circuits respectively connected thereto, the first pipeline output stage 501, the second pipeline output stage 502, and compare logics 505_1 and 505_2. The non-volatile memory device 20 may include the first data multiplexer 525 for selecting data output from the first pipeline output stage 501 and transmitting the data to the second pipeline output stage 502 and the second data multiplexer 560 that transmits data output from the second pipeline output stage 502 to a data input/output pad DQ<m:1>.

The first pipeline output stage 501 may include two wave pipeline output stages WPO1_1 and WPO1_2 connected to respective memory cell arrays through data lines DLs. The compare logics 505_1, 505_2 may be connected to the wave pipeline output stages WPO1_1 and WPO1_2, respectively. The compare logics 505_1 and 505_2 may compare output data with expected data to check the integrity of the output data. The wave pipeline output stages WPO1_1 and WPO1_2 may be described with reference to FIG. 12B.

The second pipeline output stage 502 may include a hybrid pipeline output stage HPO2. The phase of data input to the hybrid pipeline output stage HPO2 may become faster as the data is transmitted through the hybrid pipeline output stage HPO2. Data finally output from the hybrid pipeline output stage HPO2 may have the same phase, or a slightly different phase, from that of the select clock signal SEL_CLK of the second data multiplexer 560. The hybrid pipeline output stage HPO2 may be described with reference to FIG. 12A.

The second data multiplexer 560 may output data transmitted through m data lines to m data input/output pads DQ<m:1> in response to the select clock signal SEL_CLK. The second data multiplexer 560 may include m multiplexers.

Since the non-volatile memory device 20 includes a hybrid pipeline structure as described above, data may be sequentially input and output and a phase difference between the data and the select clock signal SEL_CLK of the second data multiplexer 560 may be eliminated. As a result, a data valid window may be secured and high-speed operation of the non-volatile memory device 20 may be facilitated.

Figure 14:
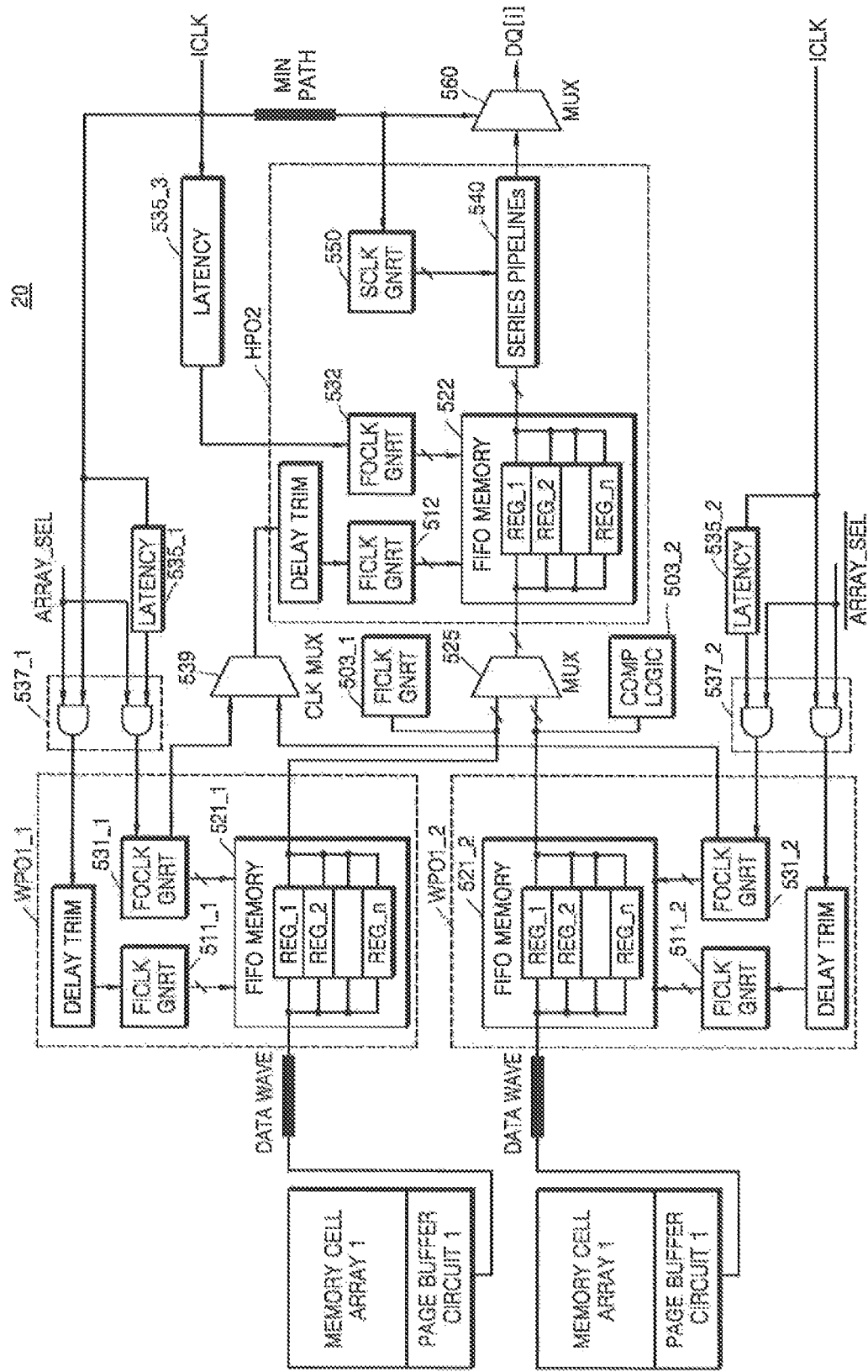
FIG. 14 is a diagram showing a non-volatile memory device according to an example embodiment of the inventive concept.

FIG. 14 is a diagram showing the non-volatile memory device 20 according to an example embodiment of the inventive concept.

FIG. 14 illustrates one example structure in which one of the structures of FIG. 13 operates in conjunction with one data input/output pad DQ[i]. In other words, the first pipeline output stage may include two wave pipeline output stages WPO1_1 and WPO1_2, and the second pipeline output stage may include the hybrid pipeline output stage HPO2 which is a combination of a wave pipeline structure and a serial pipeline structure.

The non-volatile memory device 20 may include two memory cell arrays, page buffer circuits respectively connected to thereto, a first pipeline output stage, a second pipeline output stage, compare logics 503_1 and 503_2, the first data multiplexer 525, the second data multiplexer 560, a clock multiplexer 539, latency counters 535_1 through 535_3, and clock input selectors 537_1 and 537_2.

During a data read operation, a path of data is determined in the first pipeline output stage based on an array select signal ARRAY_SEL. For example, when data is read from a first memory cell array, a first FIFO input clock generator 511_1 and a first FIFO output clock generator 531_1 are activated according to the array select signal ARRAY_SEL and operate the first wave pipeline output stage WPO1_1 including a first FIFO memory 521_1. Furthermore, according to a signal inverted from the array select signal ARRAY_SEL, a second FIFO input clock generator 511_2 and a second FIFO output clock generator 531_2 are activated, and thus the second wave pipeline output stage WPO1_2 including a second FIFO memory 521_2 may not work operate. Therefore, data may be read from the first memory cell array, transmitted through the first FIFO memory 521_1, and transmitted to the first data multiplexer 525. Data transmitted to the first data multiplexer 525 may be transmitted to the data input/output pad DQ[i] through the second pipeline output stage and the second data multiplexer 560.

A third FIFO input clock generator 512 of the second pipeline output stage may receive a signal selected from clock signals output from the first and second FIFO output clock generators 531_1 and 531_2 and matching the phase of clock signals output from the first and second FIFO output clock generators 531_1 and 531_2 of the first pipeline output stage 501. Therefore, the clock multiplexer 539 may exist between the first pipeline output stage 501 and the second pipeline output stage. The clock multiplexer 539 may select one of the clock signals generated by the first FIFO output clock generator 531_1 and the second FIFO output clock generator 531_2 and transmit the selected clock signal to the second pipeline output stage. According to an example embodiment of the inventive concept, clock multiplexer 539 may select a signal in response to the array select signal ARRAY_SEL. However, the operation of the clock multiplexer 539 is not limited thereto.

Since the non-volatile memory device 20 includes a hybrid pipeline structure as described above, data may be sequentially input and output and a phase difference between the data and the select clock signal SEL_CLK of the second data multiplexer 560 may be eliminated. As a result, a data valid window may be secured and high-speed operation of the non-volatile memory device 20 may be facilitated.

Figure 15:
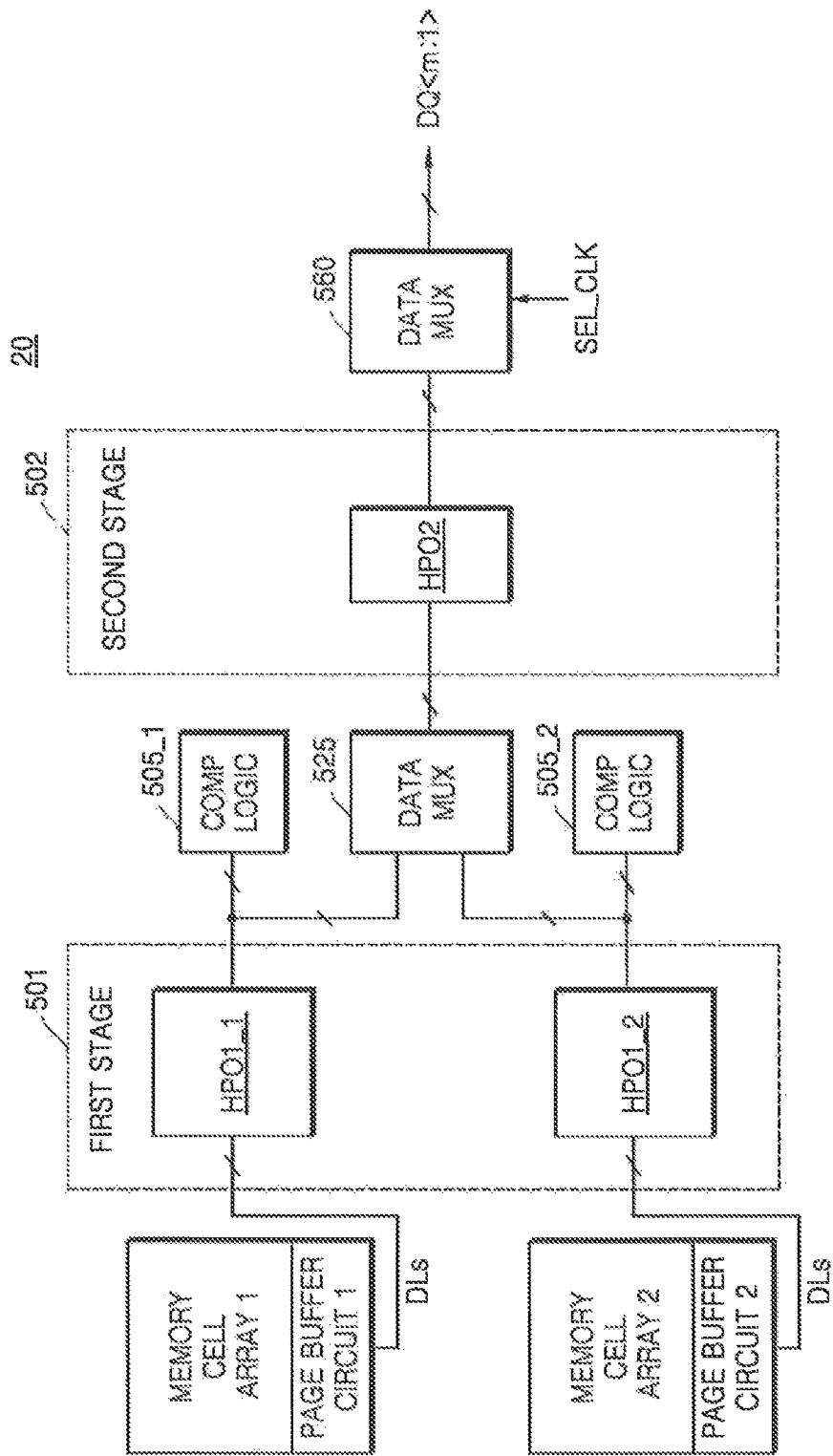
FIG. 15 is a diagram showing a non-volatile memory device according to an example embodiment of the inventive concept.

FIG. 15 is a diagram showing the non-volatile memory device 20 according to an example embodiment of the inventive concept.

The non-volatile memory device 20 may include two memory cell arrays, page buffer circuits respectively connected thereto, the first pipeline output stage 501, the second pipeline output stage 502, the first data multiplexer 525, the second data multiplexer 560, and the compare logics 505_1 and 505_2.

The first pipeline output stage 501 may include hybrid pipeline output stages HPO1_1 and HPO1_2 respectively connected to the page buffer circuit through the data lines DLs. Data transmitted through the data line DLs may be transmitted to the first data multiplexer 525 through the hybrid pipeline output stages HPO1_1 and HPO1_2. The hybrid pipeline output stages HPO1_1 and HPO1_2 may be described with reference to FIG. 12A.

The second pipeline output stage 502 may include a hybrid pipeline output stage HPO2 connected to the first data multiplexer 525 and the second data multiplexer 560. Data transmitted from the first data multiplexer 525 may be transmitted to the second data multiplexer 560 through the hybrid pipeline output stage HPO2. The hybrid pipeline output stage HPO2 may be described with reference to FIG. 12A.

Since the non-volatile memory device 20 includes the hybrid pipeline structure as described above, the data may be sequentially input and output, and the phase difference from the select clock signal (SEL_CLK) of the second data multiplexer 560 may be eliminated and the data valid speed operation of the non-volatile memory device 20 while ensuring a window (data valid window).

Since the non-volatile memory device 20 includes a hybrid pipeline structure as described above, data may be sequentially input and output and a phase difference between the data and the select clock signal SEL_CLK of the second data multiplexer 560 may be eliminated. As a result, a data valid window may be secured and high-speed operation of the non-volatile memory device 20 may be facilitated.

Figure 16:
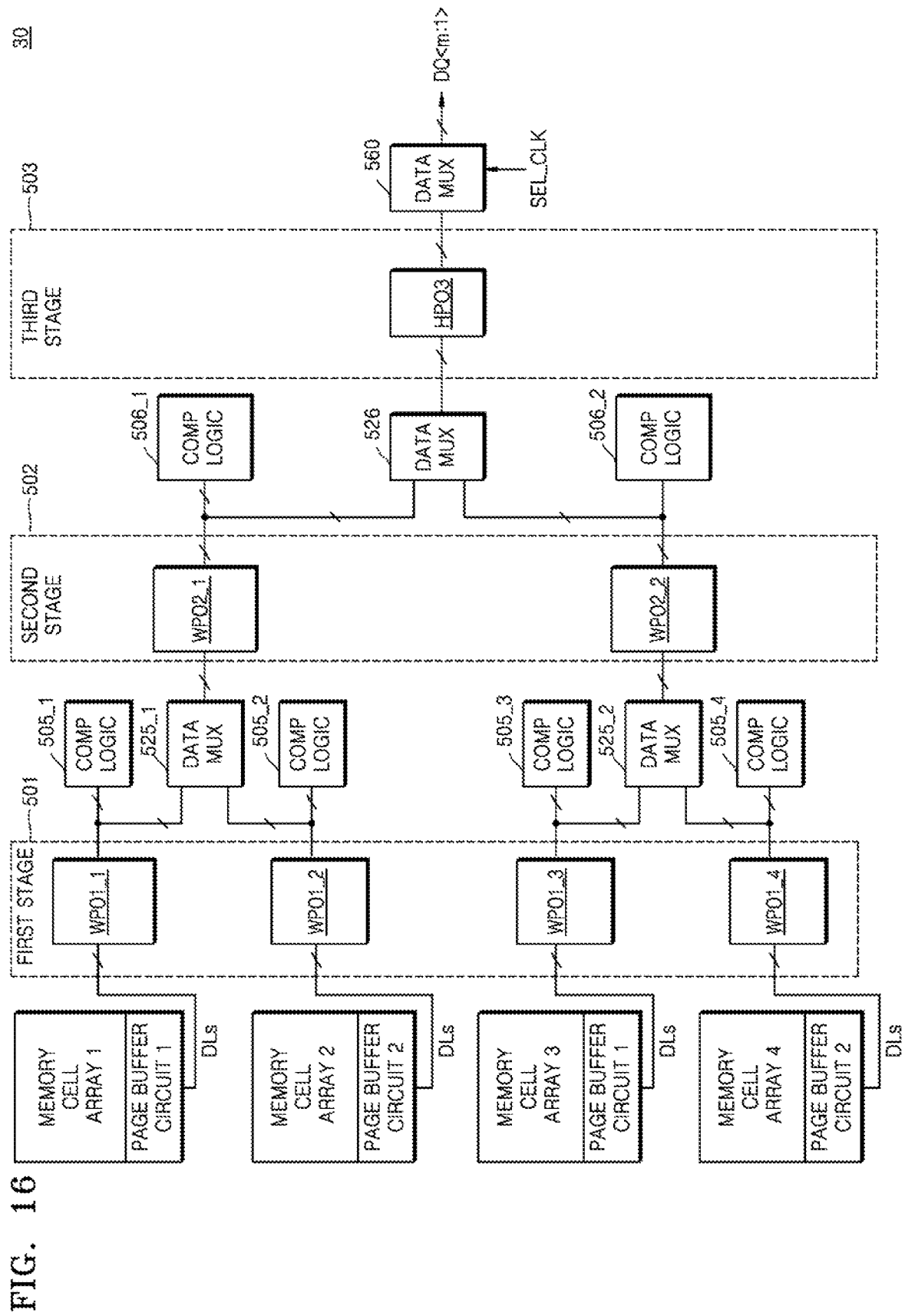
FIG. 16 is a diagram showing a non-volatile memory device according to an example embodiment of the inventive concept.

FIG. 16 is a diagram showing a non-volatile memory device 30 according to an example embodiment of the inventive concept.

The non-volatile memory device 30 includes a plurality of memory cell arrays, page buffer circuits respectively connected thereto, the first pipeline output stage 501, the second pipeline output stage 502, a third pipeline output stage 503, data multiplexers 525_1, 525_2, 526, and 560, and compare logics 505_1 through 505_4, 506_1, and 506_2.

The first pipeline output stage 501 may include a plurality of wave pipeline output stages WPO1_1, WPO1_2, WPO1_3, and WPO1_4, and the second pipeline output stage 502 may include a plurality of wave pipeline output stages WPO2_1 and WPO2_2. The wave pipeline output stages WPO1_1, WPO1_2, WPO1_3, WPO1_4, WPO2_1, and WPO2_2 may be described with reference to FIG. 12B.

The third pipeline output stage 503 may include a hybrid pipeline output stage HPO3. The phase of phase-delayed data may become faster as the phase-delayed data is transmitted through the hybrid pipeline output stage HPO3. Data finally output from the hybrid pipeline output stage HPO3 may have the same phase as the select clock signal SEL_CLK of a fourth data multiplexer 560. The hybrid pipeline output stage HPO3 may be described with reference to FIG. 12A.

Since the non-volatile memory device 30 includes a hybrid pipeline structure as described above, data may be sequentially input and output and a phase difference between the data and the select clock signal SEL_CLK of the fourth data multiplexer 560 may be eliminated. As a result, a data valid window may be secured and high-speed operation of the non-volatile memory device 30 may be facilitated.

Figure 17:
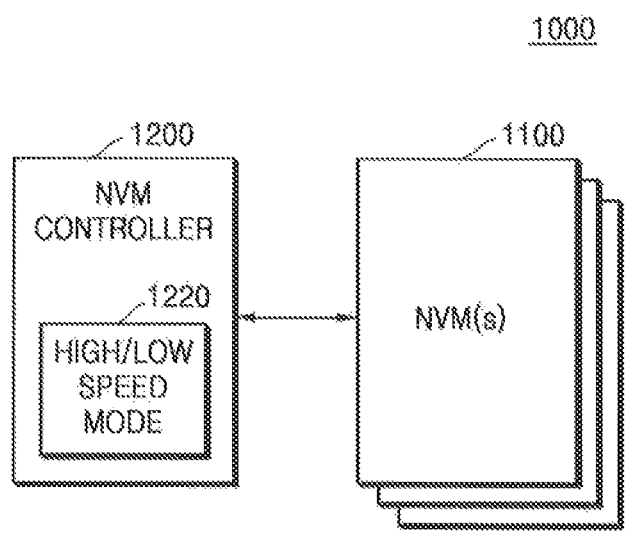
FIG. 17 is a diagram showing a storage device according to an example embodiment of the inventive concept.

FIG. 17 is a diagram showing a storage device 1000 according to an example embodiment of the inventive concept.

The storage device 1000 may include at least one non-volatile memory device 1100 and a memory controller 1200. The non-volatile memory device 1100 may be implemented as a non-volatile memory device described above with reference to FIGS. 1 through 16. In other words, the non-volatile memory device 1100 may include a hybrid pipeline structure. The non-volatile memory device 1100 may include a plurality of memory blocks, each of the plurality of memory blocks may include a plurality of pages, and each of the plurality of pages may include a plurality of memory cells.

According to an example embodiment of the inventive concept, the non-volatile memory device 1100 may be operated in either a high-speed mode or a low-speed mode under the control of the memory controller 1200. The memory controller 1200 may determine to operate the non-volatile memory device 1100 in the high-speed mode or the low-speed mode according to an external request or an internal request.

The memory controller 1200 may determine the entry of the non-volatile memory device 1100 into a fail bit count (FBC) mode. For example, the memory controller 1200 may determine the entry of the non-volatile memory device 1100 into the FBC mode during a read operation in the high-speed mode.

The memory controller 1200 may determine to adjust latency of at least one of a plurality of pipeline output stages of the non-volatile memory device 1100. The latency may include a propagation delay latency of a plurality of FIFO output clock signals controlling at least one FIFO memory included in the non-volatile memory device 1100 with respect to a plurality of FIFO input clock signals.

Since the non-volatile memory device 1100 includes a wave pipeline structure and a serial pipeline structure, the storage device 1000 according to one or more embodiments of the inventive concept may perform a data read operation at a high speed while securing a data valid window.

Figure 18:
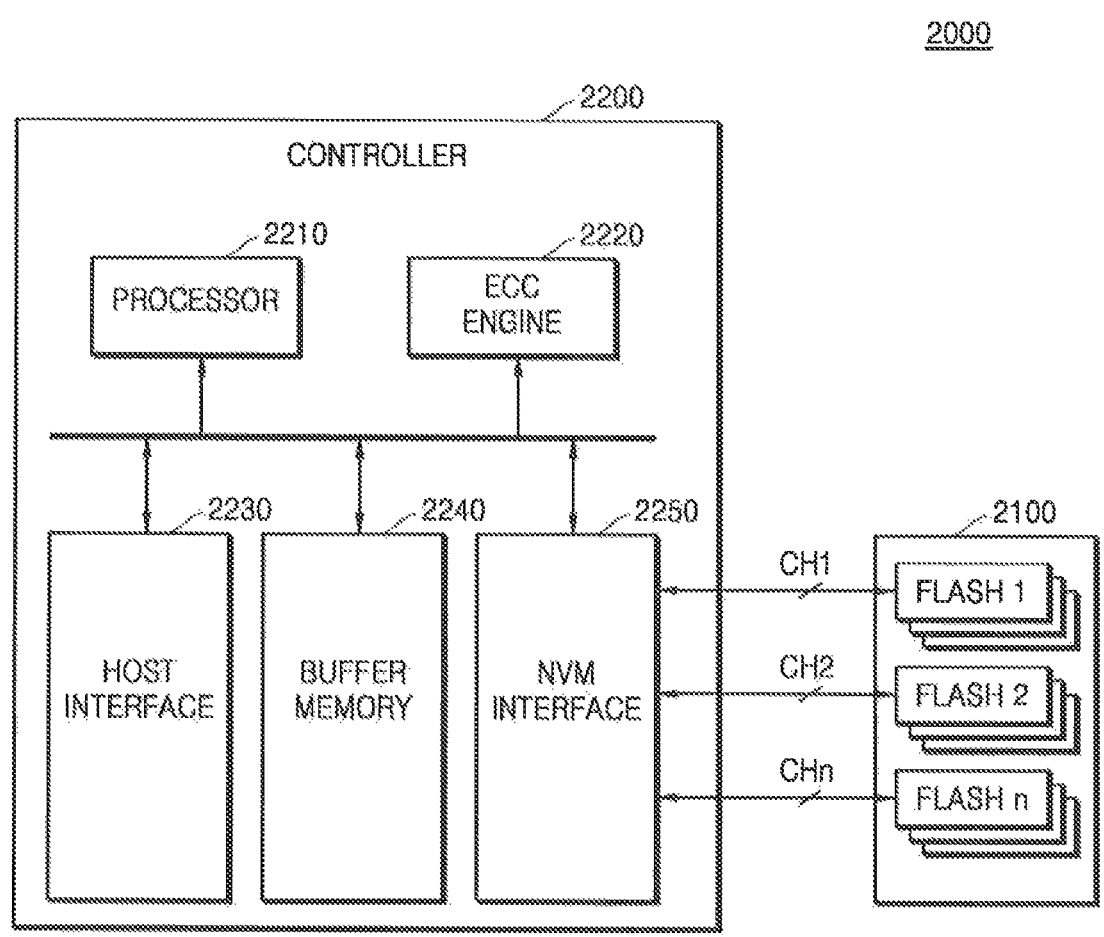
FIG. 18 is a diagram showing a solid-state drive (SSD) according to an example embodiment of the inventive concept.

FIG. 18 is a diagram showing a solid-state drive (SSD) 2000 according to an example embodiment of the inventive concept.

The SSD 2000 may include a plurality of non-volatile memory devices 2100 and an SSD controller 2200. A non-volatile memory device 2100 may be implemented as a non-volatile memory device described above with reference to FIGS. 1 through 16. In other words, the non-volatile memory device 2100 may include a hybrid pipeline structure.

The SSD controller 2200 may be connected to the non-volatile memory devices 2100 through a plurality of channels CH1 through CHn (n is a natural number greater than or equal to 2). The SSD controller 2200 may include at least one processor 2210, an ECC engine 2220, a host interface 2230, a buffer memory 2240, and a non-volatile memory interface 2250.

The ECC engine 2220 may calculate an error correction code value regarding data to be programmed during a program operation, correct an error of data read out during a read operation based on the error correction code value, and corrects an error of data recovered from the non-volatile memory devices 2100 during a data recovery operation.

The host interface 2230 may provide an interface function with an external device. Furthermore, the host interface 2230 may be implemented with various interfaces and may be implemented by a plurality of interfaces.

The non-volatile memory interface 2250 may provide an interface function with the non-volatile memory device 2100.

Since the non-volatile memory device 2100 includes a wave pipeline structure and a serial pipeline structure, the SSD 2000 according to one or more embodiments of the inventive concept may perform a data read operation at a high speed while securing a data valid window.

Figure 19A:
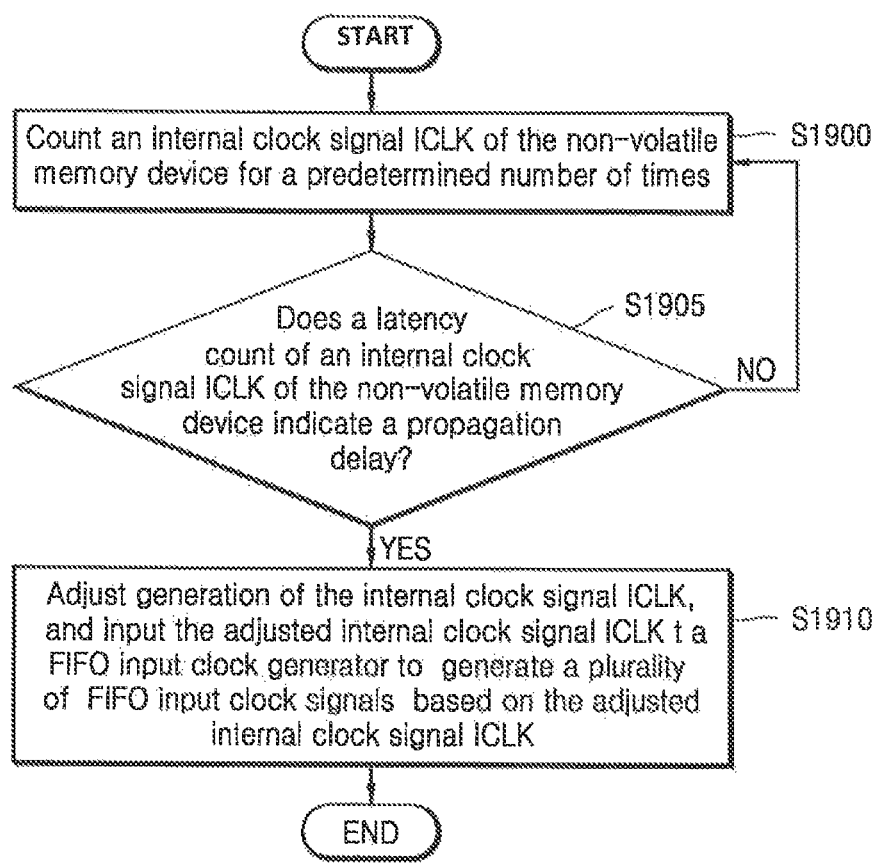
FIG. 19A is an algorithm for performing an operation of an adjusting of the internal clock signal ICLK of the non-volatile memory device according to an example embodiment of the inventive concept.

FIG. 19A is an algorithm for performing an operation of the adjustment of the internal clock signal ICLK of the non-volatile memory device according to an example embodiment of the inventive concept.

Referring to FIG. 19A, at operation S1900, an internal clock signal ICLK of the non-volatile memory device is counted for a predetermined number of times. A latency counter may be used to count the internal clock signal ICLK. The latency counter may be counting latency that corresponds to a propagation delay. The internal clock signal ICLK may be provided to, for example, a FIFO output clock generator (e.g., FIFO output clock generator 530 shown in FIG. 9).

At operation S1905, compare logic may determine that a latency count of the internal clock signal ICLK indicates a propagation delay. The latency count may be compared with pre-stored values. In there is no propagation delay, the operation may then repeat operation S1900 periodically.

At operation S1910, where it has been determined at operation S1905 that there is a propagation delay, the generation of the internal clock signal ICLK may be adjusted, for example, by a delay trim circuit 515, and the adjusted internal clock signal ICLK may be provided to the FIFO input clock generator 510 to generate FIFO input clock signals based on the adjusted internal clock signal ICLK. Thus, the pipeline latency may be compensated for by adjustment of the internal clock signal ICLK. A person of ordinary skill in the art should understand and appreciate that the aforementioned algorithm may be applied to various embodiments of the inventive concept, where, for example, there may be multiple pipeline output stages, e.g., first pipeline output stage 501, and second pipeline output stage 502, and structures with three or more pipeline output stages.

Figure 19B:
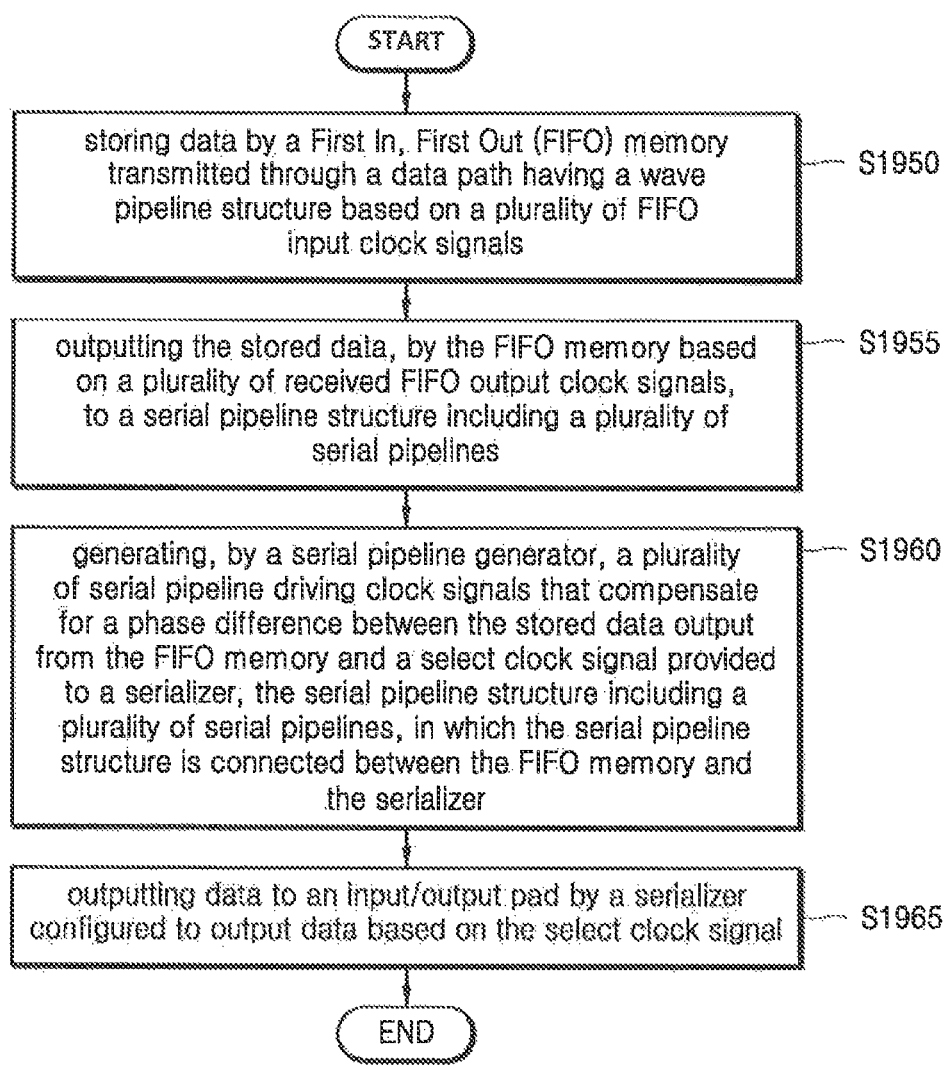
FIG. 19B is an algorithm illustrating an overview of an operation of eliminating a phase difference of a non-volatile memory device according to embodiments of the inventive concept.

FIG. 19B is an algorithm illustrating an overview of an operation of eliminating a phase difference of a non-volatile memory device according to embodiments of the inventive concept.

At operation S1950, there is a storing of data by a FIFO memory. The data has been transmitted to the FIFO memory through a data path having a wave pipeline structure, for example, as discussed above with reference to at least FIG. 2. The data is stored in accordance with a plurality of FIFO input clock signals provided to the FIFO memory.

At operation S1955, the FIFO memory, based in part received FIFO output clock signals, at least some of the stored data. The data is output to an input of a serial pipeline structure connected to the FIFO memory. A serializer is connected to the output of the serial pipeline structure.

At operation S1960, a serial pipeline generates a plurality of serial pipeline driving clock signals to be provided to the plurality of serial pipelines, respectively. The serial pipeline driving clock signals compensate for a phase difference between the stored data output from the FIFO memory and a select clock signal applied to the connected serializer.

At operation S1965, there is an output of data by the serializer to an input/output pad based on the select clock signal. As the phase difference between the output data from the FIFO memory and the select clock signals SEL-CLK of the serializer is eliminated, a high-speed operation of the non-volatile memory device may be facilitated.

Accordingly, as a conventional structure that only includes wave pipelines, there are problems with attempting to increase the operational speed. For example, even though the clock speed of a storage system may be increased, the delay time of the path of a page buffer circuit to a data multiplexer/serializer is constant, which results in increased latency. As the latency increases, the depth of a FIFO memory increases, and there can be an increased output load at a FIFO memory output stage. The increased output load causes an increase in the transmission time to the data multiplexer and a signal delay, resulting in a phase difference between the signal and a select clock signal SEL_CLK that controls the data multiplexer. The phase difference, particularly during high-speed operation of a memory device creates a problem regarding a data valid window. Thus, the conventional structure has numerous drawbacks that adversely impact attempts at high-speed operation.

In contrast to the drawbacks and problems of conventional structures, embodiments of the inventive concept improve computer functionalities and capabilities, and also improve technological operations in other fields in which the memory device is utilized. For example, in an embodiment of the inventive concept, a memory device has a structure in which a serial pipeline structure is connected to a FIFO memory output stage in series, and a plurality of serial pipelines may be connected to the FIFO memory. As the plurality of serial pipelines are controlled by a serial pipeline drive clock signal, the phase of data delayed by a data path may be accelerated by increasing a speed of driving clock signals in a direction toward the data multiplexer, which is an improvement over the constant delay time of the path of a page buffer circuit to a data multiplexer/serializer.

The embodiments of the inventive concept provide an improvement over conventional structures as the phase of data output from a FIFO memory becomes gradually faster as the data is transmitted through the serial pipeline structure, resulting in the phase of data output from the serial pipeline structure may become identical to the phase of a selected clock signal of the data multiplexer 560. Thus, the embodiments of the inventive concept provide a structure with increased operational speed over conventional structures, and the problems associated with a phase difference and signal delay of conventional structures are overcome.

While embodiments of the inventive concept have been particularly shown and described hereinabove, it will be understood by a person of ordinary skill in the art that various changes in form and details may be made therein without departing from the spirit and scope of the following claims.

What is claimed is:

1. A solid-state drive (SSD) comprising:
a plurality of flash memory devices; and
a SSD controller connected to the plurality of flash memory devices through a plurality of channels, the SSD controller comprising a non-volatile memory interface configured to provide an interface function with the plurality of flash memory devices and an ECC engine configured to correct an error of data provided from the plurality of flash memory devices based on an error correction code,
wherein at least one flash memory device of the plurality of flash memory devices comprises:
a first memory cell array comprising a plurality of flash memory cells;
a first page buffer circuit connected to the first memory cell array through a first plurality of bit lines;
a second memory cell array comprising a plurality of flash memory cells;
a second page buffer circuit connected to the second memory cell array through a second plurality of bit lines;
a first FIFO memory configured to receive first data transmitted from the first page buffer circuit and to output the first data sequentially;
a second FIFO memory configured to receive second data transmitted from the second page buffer circuit and to output the second data sequentially;
a first MUX configured to select one of the first data output from the first FIFO memory and the second data output from the second FIFO memory and to output the selected one as third data;
a third FIFO memory configured to receive the third data output from the first MUX and output the third data sequentially;
a serial pipeline structure connected to the third FIFO memory and configured to output the third data output from the first MUX; and
a second MUX configured to output the third data output from the serial pipeline structure based on a select clock signal.

2. The SSD of claim 1, wherein the serial pipeline structure comprises, a plurality of serial pipelines, and the at least one flash memory device further comprises:
a serial pipeline driving clock signal generator configured to generate a plurality of serial pipeline driving clock signals for controlling the plurality of serial pipelines.

3. The SSD of claim 2, wherein a phase of the plurality of serial pipeline driving clock signals is delayed from the second MUX to the third FIFO memory.

4. The SSD of claim 2, wherein the select clock signal is generated from an internal clock signal and at external clock signal, and the plurality of serial pipeline driving clock signals are generated based on the select clock signal.

5. The SSD of claim 2, the serial pipeline driving dock signal generator comprises a plurality of phase delay elements configured to delay sequentially a phase of the plurality of serial pipeline driving clock signals.

6. The SSD of claim 1, the third FIFO memory comprises a plurality of registers configured to receive the third data output from the first MUX based on a FIFO input clock signals generated by a FIFO input dock generator and to output the third data based on a FIFO output clock signals generated based on an internal clock signal and a propagation delay.

7. The SSD of claim 1, the first data is transmitted through a first data path having a wave pipeline structure from the first page buffer circuit to the first FIFO memory, and the second data is transmitted through a second data path having a wave pipeline structure from the second page buffer circuit to the second FIFO memory, and the serial pipeline structure is further configured to compensate a phase difference between the third data output from the third FIFO memory and the select clock signal.

8. A solid-state drive (SSD) comprising:
a plurality of flash memory devices; and
a SSD controller connected to the plurality of flash memory devices through a plurality of channels, the SSD controller comprising at least one processor, a non-volatile memory interface configured to provide an interface function with the plurality of flash memory devices, an ECC engine configured to correct an error of data provided from the plurality of flash memory devices based on an error correction code, and a buffer memory configured to temporarily store data provided from the plurality of flash memory devices,
wherein at least one flash memory device of the plurality of flash memory devices comprises:
a first memory cell array comprising a plurality of flash memory cells;
a first page buffer circuit connected to the first memory cell array through a first plurality of bit lines;
a second memory cell array comprising a plurality of flash memory cells;
a second page buffer circuit connected to the second memory cell array through a second plurality of bit lines;

a first wave pipeline output stage configured to receive first data transmitted through a first data path having a wave pipeline structure from the first page buffer circuit and output the first data;

a second wave pipeline output stage configured to receive second data transmitted through a second data path having a wave pipeline structure from the second page buffer circuit and output the second data;

a first MUX configured to select one of the first data output from the first wave pipeline output stage and the second data output from the second wave pipeline output stage and to output the selected one as third data;

a hybrid pipeline output stage, configured to receive third data output from the first MUX and output the third data; and a second MUX configured to output the third data output from the hybrid pipeline output stage based on a select clock signal, wherein the first wave pipeline output stage comprises:

a first FIFO input clock signal generator configured to generate a first FIFO input clock signals;

a first FIFO output dock signal generator configured to generate a first FIFO output clock signals;

a first FIFO memory configured to receive the first data transmitted from the first page buffer circuit based on the first FIFO input clock signals and to output fhe first data based on the first FIFO output clock signals, and wherein the second wave pipeline output stage comprises:

a second FIFO input clock signal generator configured to generate a second FIFO input clock signals;

a second FIFO output clock signal generator configured to generate a second FIFO output clock signals;

a second FIFO memory configured to receive the second data transmitted from the second page buffer circuit based on the second FIFO input clock signals and to output the second data based on the second FIFO output clock signals, and wherein the hybrid pipeline output stage comprises:

a third FIFO input clock signal generator configured to generate a third FIFO input clock signals;

a third FIFO output clock signal generator configured to generate a third FIFO output clock signals;

a third FIFO memory configured to receive the third data output from the first MUX based on the third FIFO input clock signals and to output the third data based on the third FIFO output clock signals; and a serial pipeline structure configured to receive the third data output from the third FIFO memory and output the third data and comprised of a plurality of serial pipelines.

9. The SSD of claim 8, wherein the serial pipeline structure is further configured to compensate a phase difference between the third data output from the third FIFO memory and the select clock signal, and the hybrid pipeline output stage further comprises:

a serial pipeline driving clock signal generator configured to generate a plurality of serial pipeline driving clock signals for controlling the plurality of serial pipelines.

10. The SSD of claim 9, wherein a phase of the plurality of serial pipeline driving clock signals is delayed from the second MUX to the third FIFO memory.

11. The SSD of claim 9, wherein the select clock signal is generated from an internal clock signal and an external clock signal, and the plurality of serial pipeline driving clock signals are generated based on the select clock signal.

12. The SSD of claim 9, wherein the serial pipeline driving clock signal generator comprises a plurality of phase delay elements configured to delay sequentially a phase of the plurality of serial pipeline driving clock signals.

13. The SSD of claim 8, wherein the at least one flash memory device further comprises:

a clock signal MUX configured to select clock signals among the first FIFO output clock signals and the second FIFO output clock signals, and the third FIFO input clock signal generator is further configured to;

generate the third FIFO input clock signals based on the selected clock signals.

14. The SSD of claim 8, further comprising a compare logic connected to the second FIFO memory and configured to compare expected data with the second data output from the second FIFO memory.

15. A solid-state drive (SSD) comprising:

a plurality of flash memory devices; and a SSD controller connected to the plurality of flash memory devices through a plurality of channels, the SSD controller comprising at least one processor, a non-volatile memory interface configured to provide an interface function with the plurality of flash memory devices and an ECC engine configured to correct an error of data provided from the plurality of flash memory devices based on an error correction code, and a buffer memory configured to temporarily store data provided from the plurality of flash memory devices, wherein at least one flash memory device of the plurality of flash memory devices comprises:

a first memory cell array comprising a plurality of flash memory cells;

a first page buffer circuit connected to the first memory cell array through a first plurality of bit lines;

a second memory cell array comprising a plurality of flash memory cells;

a second page buffer circuit connected to the second memory cell array through a second plurality of bit lines;

a third memory cell array comprising a plurality of flash memory cells;

a third page buffer circuit connected to the third memory cell array through a third plurality of bit lines;

a fourth memory cell array comprising a plurality of flash memory cells;

a fourth page buffer circuit connected to the fourth memory cell array through a fourth plurality of bit lines;

a first pipeline output stage comprising a first pipeline output stage configured to sequentially output first data transmitted from the first page buffer circuit, a second pipeline output stage configured to, sequentially output second data transmitted from the second page buffer circuit, a third pipeline output stage configured to sequentially output third data transmitted from the third page buffer circuit and a fourth pipeline output stage configured to sequentially output fourth data transmitted from the fourth page buffer circuit;

a first MUX configured to output one of the first data output from the first pipeline output stage and the second data output from the second pipeline output stage as fifth data;

a second MUX configured to output one of the third data output from the third pipeline output stage and the fourth data output from the fourth pipeline output stage as sixth data;

a second pipeline output stage comprising a fifth wave pipeline output stage configured to sequentially output the fifth data output from the first MUX and a sixth wave pipeline output stage configured to sequentially output the sixth data output from the second MUX;

a third MUX configured to output one of the fifth data output from the fifth wave pipeline output stage and the sixth data output from the sixth wave pipeline output stage as seventh data;

a hybrid pipeline output stage configured to receive seventh data output from the third MUX and output the seventh data; and a fourth MUX configured to output the seventh data output from the hybrid pipeline output stage based on a select clock signal, wherein the hybrid pipeline output stage comprises:

a FIFO memory configured to receive the seventh data output from the third MUX based on FIFO input clock signals and to output the seventh data based on FIFO output dock signals; and a serial pipeline structure configured to receive the third data output from the FIFO memory and output the third data and comprised of a plurality of serial pipelines.

16. The SSD of claim 15, wherein the serial pipeline structure is further configured to compensate a phase difference between the seventh data output from the FIFO memory and the select clock signal, and the at least one flash memory device further comprises:

a serial pipeline driving clock signal generator configured to generate a plurality of serial pipeline driving clock signals for controlling the plurality of serial pipelines.

17. The SSD of claim 16, wherein a phase of the plurality of serial pipeline driving clock signals is delayed from the forth MUX to the FIFO memory.

18. The SSD of claim 16, wherein the select clock signal is generated from an internal, clock signal and an external clock signal, and the plurality of serial pipeline driving clock signals are generated based on the select clock signal.

19. The SSD of claim 16, the serial pipeline driving clock signal generator comprises a plurality of phase delay elements configured to delay sequentially a phase of the plurality of serial pipeline driving clock signals.

20. The SSD of claim 15, wherein the FIFO memory comprises a plurality of registers configured to receive the seventh data output from the third MUX based on the FIFO input clock signals generated by a FIFO input clock generator and to output the seventh data from the third MUX based on the FIFO output clock signals generated based on an internal clock signal and a propagation delay.

* * * * *